(12) United States Patent
Hunt et al.

(10) Patent No.: US 6,207,522 B1
(45) Date of Patent: Mar. 27, 2001

(54) FORMATION OF THIN FILM CAPACITORS

(75) Inventors: Andrew T. Hunt, Atlanta; Tzyy Jiuan Hwang, Alpharetta, both of GA (US); Helmut G. Hornis, Hudson, OH (US); Wen-Yi Lin, Doraville, GA (US)

(73) Assignee: MicroCoating Technologies, Chamblee, GA (US)

( * ) Notice: Subject to any disclaimer, the term of this patent is extended or adjusted under 35 U.S.C. 154(b) by 0 days.

(21) Appl. No.: 09/198,285

(22) Filed: Nov. 23, 1998

(51) Int. Cl.[7] ........................................... H01L 21/20
(52) U.S. Cl. ........................................................... 438/393
(58) Field of Search ........................... 438/393, 394–395, 438/399, 171, 190, 210, 238, 239, 250–256; 428/458; 361/748; 29/25.03; 427/29

(56) References Cited

U.S. PATENT DOCUMENTS

| | | | |
|---|---|---|---|
| 3,481,781 | 12/1969 | Kern et al. | 117/215 |
| 4,277,525 | 7/1981 | Nakayama et al. | 427/387 |
| 4,501,602 | 2/1985 | Miller et al. | 65/18.2 |
| 4,645,524 | 2/1987 | Bocko et al. | 65/18.1 |
| 5,043,002 | 8/1991 | Dobbins et al. | 65/3.12 |
| 5,079,069 | 1/1992 | Howard et al. | 428/209 |
| 5,152,819 | 10/1992 | Blackwell et al. | 65/3.12 |
| 5,154,744 | 10/1992 | Blackwell et al. | 65/3.12 |
| 5,155,655 | 10/1992 | Howard et al. | 361/303 |
| 5,161,086 | 11/1992 | Howard et al. | 361/321 |
| 5,261,153 | 11/1993 | Lucas | 29/830 |
| 5,347,258 | 9/1994 | Howard et al. | 338/333 |
| 5,356,672 | 10/1994 | Schmitt, III et al. | 427/446 |
| 5,410,107 | 4/1995 | Schaper | 174/255 |
| 5,454,847 | 10/1995 | Jacoboni et al. | 65/386 |
| 5,466,892 | 11/1995 | Howard et al. | 174/261 |
| 5,652,021 | 7/1997 | Hunt et al. | 427/428 |
| 5,670,262 | * 9/1997 | Dalman | 426/458 |

FOREIGN PATENT DOCUMENTS

WO 96/33298   4/1996   (WO) .
WO 97/38429   3/1997   (WO) .

OTHER PUBLICATIONS

G. Stauf et al., Thin Film High K Dielectrics for Integrated Passive Devices, *The International Journal of Microcircuits and Electronic Packaging*, V. 20 n. 2, 2nd qtr., 1997.

Hunt et al., Chemical Vapor Deposition and Powder Formation Using Thermal Spray with Near Supercritical and Supercritical Fluid Solutions, U.S. Patent Appl. Serial No. 08/691,853, filed Aug. 2, 1996.

* cited by examiner

Primary Examiner—Charles Bowers
Assistant Examiner—Craig Thompson

(57) ABSTRACT

Thin layer capacitors are formed from a first flexible metal layer, a dielectric layer between about 0.03 and about 2 microns deposited thereon, and a second flexible metal layer deposited on the dielectric layer. The first flexible metal layer may either be a metal foil, such as a copper, aluminum, or nickel foil, or a metal layer deposited on a polymeric support sheet. Depositions of the layers is by or is facilitate by combustion chemical vapor deposition or controlled atmosphere chemical vapor deposition.

11 Claims, 6 Drawing Sheets

FORMATION OF THIN FILM CAPACITORS

The present invention is directed to the formation of thin layer capacitors, preferably for printed circuitry, such thin layers being capable of being embedded within a printed circuit board. In particular, the invention is directed to forming thin layer capacitors from thin layers of dielectric material which may be deposited by combustion chemical vapor deposition.

BACKGROUND OF THE INVENTION

Combustion chemical vapor deposition ("CCVD"), a recently invented CVD technique, allows for open atmosphere deposition df thin films. The CCVD process offers several advantages over other thin-film technologies, including traditional CVD. The key advantage of CCVD is its ability to deposit films in the open atmosphere without any costly furnace, vacuum, or reaction chamber. As a result, the initial system capitalization requirement can be reduced up to 90% compared to a vacuum based system. Instead of a specialized environment, which is required by other technologies, a combustion flame provides the necessary environment for the deposition of elemental constituents from solution, vapor, or gas sources. The precursors are generally dissolved in a solvent that also acts as the combustible fuel. Depositions can be performed at atmospheric pressure and temperature within an exhaust hood, outdoors, or within a chamber for control of the surrounding gasses or pressure.

Because CCVD generally uses solutions, a significant advantage of this technology is that it allows rapid and simple changes in dopants and stoichiometries which eases deposition of complex films. The CCVD technique generally uses inexpensive, soluble precursors. In addition, precursor vapor pressures do not play a role in CCVD because the dissolution process provides the energy for the creation of the necessary ionic constituents. By adjusting solution concentrations and constituents, a wide range of stoichiometries can be deposited quickly and easily. Additionally, the CCVD process allows both chemical composition and physical structure of the deposited film to be tailored to the requirements of the specific application.

Unlike conventional CVD, the CCVD process is not confined to an expensive, inflexible, low-pressure reaction chamber. Therefore, the deposition flame, or bank of flames, can be moved across the substrate to easily coat large and/or complex surface areas. Because the CCVD process is not limited to specialized environments, the user can continuously feed materials into the coating area without disruption, thereby permitting batch processing. Moreover, the user can limit deposition to specific areas of a substrate by simply controlling the dwell time of the flame(s) on those areas. Finally, the CCVD technology generally uses halogen-free chemical precursors having significantly reduced negative environmental impact.

Numerous materials have been deposited via CCVD technology with the combustion of a premixed precursor solution as the sole heat source. This inexpensive and flexible film deposition technique permits broad use of thin film technology. The CCVD process has much of the same flexibility as thermal spraying, yet creates quality, conformal films like those associated with conventional CVD. With CCVD processing, a desired phase can be deposited in a few days and at relatively low cost.

A preferred embodiment of the CCVD process is described in detail in U.S. application Ser. No. 08/691,853 filed Aug. 2, 1996, the teachings of which are incorporated herein by reference. In accordance with that application, a CCVD produces vapor formed films, powders and nanophase coatings from near-supercritical liquids and supercritical fluids. Preferably, a liquid or liquid-like solution fluid containing chemical precursor(s) is formed. The solution fluid is regulated to near or above the critical pressure and is then heated to near the supercritical temperature just prior to being released through a restriction or nozzle which results in a gas entrained very finely atomized or vaporized solution fluid. The solution fluid vapor is combusted to form a flame or is entered into a flame or electric torch plasma, and the precursor(s) react to the desired phase in the flame or plasma or on the substrate surface. Due to the high temperature of the plasma much of the precursor will react prior to the substrate surface. A substrate is positioned near or in the flame or electric plasma, and a coating is deposited. Alternatively, the material formed can be collected as a nanophase powder.

Very fine atomization, nebulization, vaporization or gasification is achieved using solution fluids near or above the critical pressure and near the critical temperature. The dissolved chemical precursor(s) need not have high vapor pressure, but high vapor pressure precursors can work well or better than lower vapor pressure precursors. By heating the solution fluid just prior to or at the end of the nozzle or restriction tube (atomizing device), the available time for precursor chemical reaction or dissolution prior to atomization is minimized. This method can be used to deposit coatings from various metalorganics and inorganic precursors. The fluid solution solvent can be selected from any liquid or supercritical fluid in which the precursor(s) can form a solution. The liquid or fluid solvent by itself can consist of a mixture of different compounds.

A reduction in the supercritical temperature of the reagent containing fluid produces superior coatings. Many of these fluids are not stable as liquids at STP, and must be combined in a pressure cylinder or at a low temperature. To ease the formation of a liquid or fluid solution which can only exist at pressures greater than ambient, the chemical precursor(s) are optionally first dissolved in primary solvent that is stable at ambient pressure. This solution is placed in a pressure capable container, and then the secondary (or main) liquid or fluid (into which the primary solution is miscible) is added. The main liquid or fluid has a lower supercritical temperature, and results in a lowering of the maximum temperature needed for the desired degree of nebulization. By forming a high concentration primary solution, much of the resultant lower concentration solution is composed of secondary and possible additional solution compounds. Generally, the higher the ratio of a given compound in a given solution, the more the solution properties behave like that compound. These additional liquids and fluids are chosen to aid in the very fine atomization, vaporization or gasification of the chemical precursor(s) containing solution. Choosing a final solution mixture with low supercritical temperature additionally minimizes the occurrence of chemical precursors reacting inside the atomization apparatus, as well as lowering or eliminating the need to heat the solution at the release area. In some instances the solution may be cooled prior to the release area so that solubility and fluid stability are maintained. One skilled in the art of supercritical fluid solutions could determine various possible solution mixtures without undue experimentation. Optionally, a pressure vessel with a glass window, or with optical fibers and a monitor, allows visual determination of miscibility and solute-solvent compatibility.

Conversely, if in-line filters become clogged or precipitant is found remaining in the main container, an incompatibility under those conditions may have occurred.

Another advantage is that release of fluids near or above their supercritical point results in a rapid expansion forming a high speed gas-vapor stream. High velocity gas streams effectively reduce the gas diffusion boundary layer in front of the deposition surface which, in turn, improves film quality and deposition efficiency. When the stream velocities are above the flame velocity, a pilot light or other ignition means must be used to form a steady state flame. In some instances two or more pilots may be needed to ensure complete combustion. Alternatively, instead of flames, the precursor can be passed through hot gasses, plasma, laser or other energetic zones. With the plasma torch and other energetic zones, no pilot lights are needed, and high velocities can be easily achieved by following operational conditions known by one of ordinary skill in the art.

The solute-containing fluid need not be the fuel for the combustion. Noncombustible fluids like water $N_2O$ or $CO_2$, or difficult to combust fluids like ammonia, can be used to dissolve the precursors or can serve as the secondary solution compound. These are then expanded into a flame or plasma torch which provides the environment for the precursors to react. The depositions can be performed above, below or at ambient pressure. Plasma torches work well at reduced pressures. Flames can be stable down to 10 torr, and operate well at high pressures. Cool flames of even less than 500° C. can be formed at lower pressures. While both can operate in the open atmosphere, it can be advantageous to practice the methods of the invention in a reaction chamber under a controlled atmosphere to keep airborne impurities from being entrained into the resulting coating. Many electrical and optical coating applications require that no such impurities be present in the coating. These applications normally require thin films, but thicker films for thermal barrier, corrosion and wear applications can also be deposited.

Further bulk material can be grown, including single crystals, by extending the deposition time even further. The faster epitaxial deposition rates provided by higher deposition temperatures, due to higher diffusion rates, can be necessary for the deposition of single crystal thick films or bulk material.

CCVD is a flame process which utilizes oxygen. While it may be possible using CCVD to deposit oxygen-reactive materials with CCVD by depositing in the reducing portions of the flame, a better technique for depositing oxygen reactive materials, such as nickel, is a related process described in U.S. patent application Ser. No. 09/067,975, filed Apr. 20, 1998, the teachings of which are incorporated herein by reference.

The invention described in referenced U.S. patent application Ser. No. 09/067,975 provides an apparatus and method for chemical vapor deposition wherein the atmosphere in a coating deposition zone is established by carefully controlling and shielding the materials fed to form the coating and by causing the gases removed from the deposition zone to pass through a barrier zone wherein they flow away from said deposition zone at an average velocity greater than 50 feet per minute, and preferably greater than 10 feet per minute. The rapid gas flow through the barrier zone essentially precludes the migration of gases from the ambient atmosphere to the deposition zone where they could react with the coating or the materials from which the coating is derived. Careful control of the materials used to form the coating can be provided by feeding the coating precursors in a fixed proportion in a liquid media. The liquid media is atomized as it is fed to a reaction zone wherein the liquid media is vaporized and the coating precursors react to form reacted coating precursors. Alternatively, the coating precursor(s) can be fed as a gas, either as itself or as a mixture in a carrier gas. The reacted coating precursors are often composed of partially, fully and fractionally reacted components, which can flow as a plasma to the deposition zone. The reacted coating precursors contact and deposit the coating on the surface of the substrate in the deposition zone. A curtain of flowing inert gases may be provided around the reaction zone to shield the reactive coating materials/plasma in that zone from contamination with the materials used in the surrounding apparatus or with components of the ambient atmosphere.

The vaporization of the liquid media and reaction of the coating precursors in the reaction zone requires an input of energy. The required energy can be provided from various sources, such as electrical resistance heating, induction heating, microwave heating, RF heating, hot surface heating and/or mixing with hot inert gas.

Herein, non-combustion process will be referred to as "Controlled Atmosphere Combustion Chemical Vapor Deposition" (CACCVD). This technique provides a relatively controlled rate of energy input, enabling high rates of coating deposition. In some preferred cases, the liquid media and/or a secondary gas used to atomize the liquid media can be a combustible fuel used in the CACCVD. Particularly important is the capability of CACCVD to form high quality adherent deposits at or about atmospheric pressure, thereby avoiding the need to be conducted in elaborate vacuum or similar isolation housings. For these reasons, in many cases, CACCVD thin film coatings can be applied in situ, or "in the field", where the substrate is located.

Combustion chemical vapor deposition (CCVD) is not suitable for those coating applications which require an oxygen free environment. For such applications, CACCVD, which employs non-combustion energy sources such as hot gases, heated tubes, radiant energy, microwave and energized photons as with infrared or laser sources are suitable. In these applications it is important that all of the liquids and gases used be oxygen-free. The coating precursors can be fed in solution or suspension in liquids such as ammonia or propane which are suitable for the deposit of nitrides or carbides, respectively.

CACCVD processes and apparatus provide control over the deposition zone atmosphere, thereby enabling the production of sensitive coatings on temperature sensitive or vacuum sensitive substrates, which substrates can be larger than could otherwise be processed by conventional vacuum chamber deposition techniques.

A further advantage of CACCVD is its ability to coat substrates without needing additional energy supplied to the substrate. Accordingly, this system allows substrates to be coated which previously could not withstand the temperatures to which substrates were subjected by most previous systems. For instance, nickel coatings can be provided on polyamide sheet substrates without causing deformation of the substrate. Previously atmospheric pressure deposition techniques were unable to provide chemical vapor deposition of metallic nickel because of its strong affinity to oxygen, while vacuum processing of polyamide sheet substrates was problematical due to its outgassing of water and tendency toward dimensional instability when subjected to heat and vacuum.

The present invention is directed particularly to the formation of thin layer capacitors, it is preferred that at least one layer of such capacitors being conveniently deposited by CCVD or CACCVD. Generally, a capacitor comprises a pair of electrically conductive plates with a dielectric material interposed between the plates, whereby the plates are capable of holding an electrical charge. Thin layer capacitors formed in accordance with the invention involve the formation of a thin layer of dielectric material in intimate contact with electrically conducting plate layers.

As a simple configuration of a thin layer capacitor, a dielectric material layer may be formed on a metal foil or metal layer, and a second metal layer formed on the opposite surface of the dielectric material layer. Such a three layer structure is itself a capacitor and may be used, as such, as a decoupling capacitor.

Using the three-layer structure described in the above paragraph, a plurality of discrete capacitors can be formed by patterning at least one of the electrically conductive layers, typically the second metal layer formed on the dielectric layer. Such patterning of the metal layer can be accomplished by conventional photoresist techniques followed by etching of the metal layer so as to form a pattern of discrete plates on one surface of the dielectric material layer. In such a structure, the other metal layer, e.g., the metal foil layer, serves as a common capacitor plate for holding charge relative to the opposed discrete capacitor plates. Alternatively, both metal layers may be patterned by photoresist/etching techniques.

Instead of the first layer being a metal foil, the first layer may also be a thin metal layer deposited on a polymeric film, e.g., a polyamide film. Subsequently, a dielectric material layer and a second metal layer are deposited thereon. The second metal layer may be patterned as described above to form discrete capacitor plates.

It is also possible to pattern a dielectric material layer by photoresist/etching techniques. For example, silica based glasses, deposited as thin dielectric material layers in accordance with the invention, may be etched with ammonium hydrogen difluoride, fluoroboric acid, and mixtures thereof.

Capacitor configurations are described, for example, in U.S. Pat. Nos. 5,079,069, 5,155,655, and 5,410,107, the teachings of each of which are incorporated by reference.

Thin layer capacitors for printed circuit boards require large areas and some flexibility for reasons having to do with handling, robustness, flow weight and thermal expansion of the materials, etc., and layered structures from which the capacitors are formed must have some flexibility. This is to be distinguished from the smaller more rigid structures of silicon chip technology. Because flexibility is required and because the dielectric materials used herein are generally glassy, e.g., silica, the dielectric layers are necessarily very thin, i.e., 2 microns or thinner, preferably 1 micron or thinner.

The substrate material should be thing capable of being rolled and should be available in many widths, and long lengths. Materials such as metals foils and polymers satisfy these needs while silicon does not. Silicon is easier to deposit on by most techniques because it is stiff, does not out-gas and is of small size. CCVD is able to coat the desired substrates with quality coatings.

SUMMARY OF THE INVENTION

In accordance with the present invention thin layer capacitors are formed on a flexible substrate, which capacitors may be embedded within a printed circuit board. On a flexible substrate is formed a thin layer of dielectric material. Preferably, the dielectric material is deposited on the substrate by combustion chemical vapor deposition (CCVD).

In one embodiment of the invention, a dielectric layer is deposited on a metal foil, such as copper, nickel or aluminum foil. Then, on the opposite side of the dielectric layer is deposited a second conducting layer, usually of metal. The second conductive layer may be deposited entirely by CCVD, or CACCVD. Alternatively, a seed layer, such as a thin layer of platinum, may be deposited by CCVD and then a thicker metal layer built up by electroplating to form the three-layer capacitor structure. Such a three-layer structure may, without further processing, act as a capacitor, e.g., a decoupling capacitor, or the three-layer structure may be further processed to form a multi-capacitor component. The thin layer capacitor structures described herein, are typically embedded in dielectric material, e.g., epoxy-based prepreg, so as to function as a capacitor layer within an electronic circuit board.

Embedded capacitors of the type taught in accordance with the invention enable further miniaturization of printed circuit boards (PCBs) because fabrication no longer requires discrete capacitors that have to be large enough to be handled either by robot arms and or humans and soldered to the traces on the face of a printed circuit board.

DETAILED DESCRIPTION OF THE PREFERRED EMBODIMENTS

Figure 1:
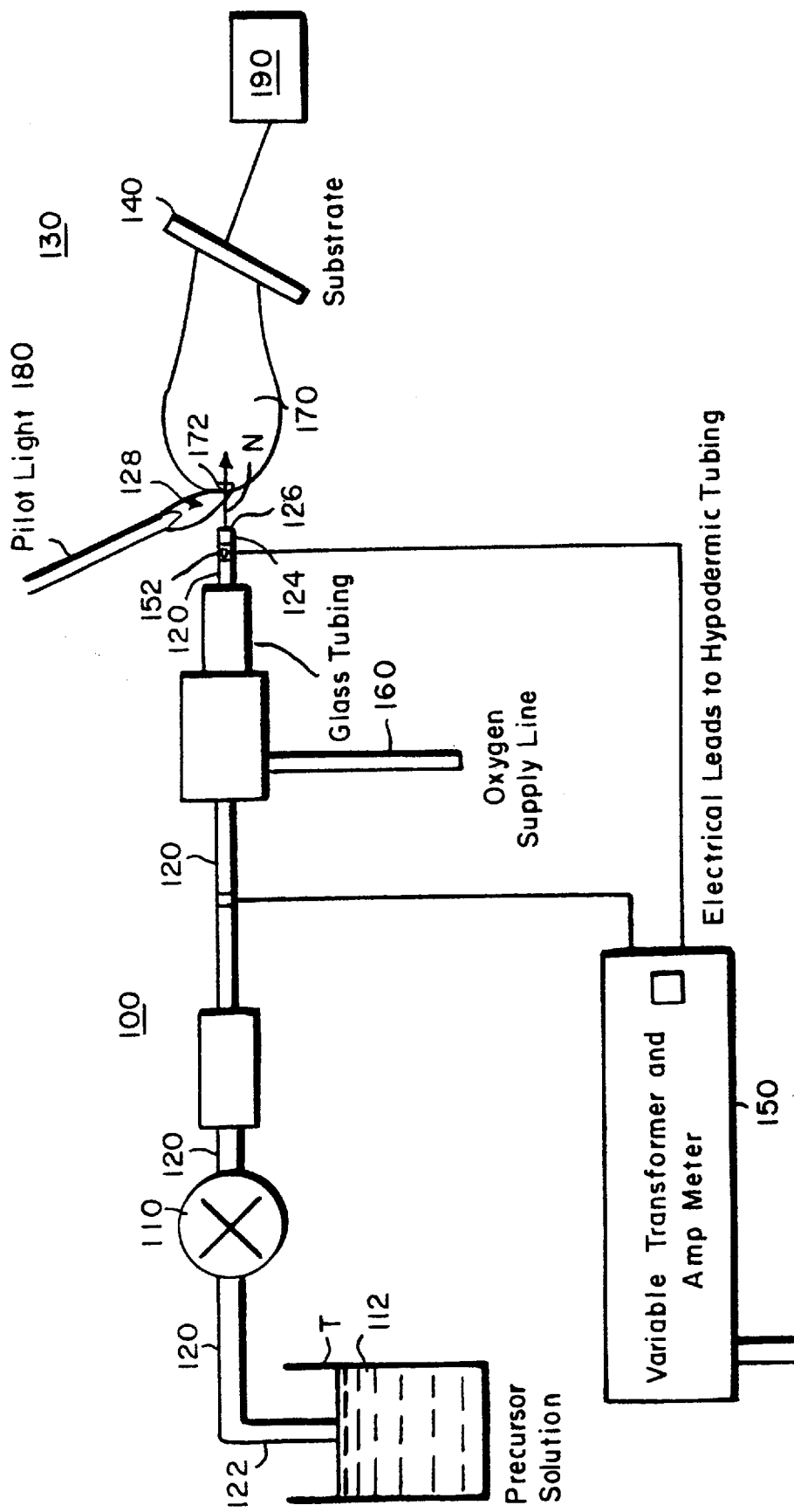
FIG. 1 shows a schematic diagram of the apparatus of the invention.

The present invention may be understood more readily by reference to the following detailed description of preferred embodiments of the invention and the Figures.

It is to be understood that the terminology used herein is for the purpose of describing particular embodiments only and is not intended to be limiting. It must be noted that, as used in the specification and the appended claims, the singular forms "a," "an" and "the" include plural referents unless the context clearly dictates otherwise.

Throughout this application, where publications are referenced, the disclosures of these publications in their entireties are hereby incorporated by reference into this application in order to more fully describe the state of the art to which this invention pertains.

The present invention provides a method for coating a substrate with a selected material. The method comprises, at a first selected temperature and a first selected pressure, dissolving into a suitable carrier to thereby form a transport solution one or more reagents capable of reacting (where, for a single precursor reagent, the precipitation of the reagent from the solution or change in chemical bonds is herein considered a "reaction") to form the selected material. At some time prior to the actual deposition, a substrate is positioned in a region having a second selected pressure. The second selected pressure can be ambient pressure and is generally above 20 torr. The transport solution is then pressurized to a third selected pressure above the second selected pressure using a pressure regulating means. One of skill in the art would recognize that there are many suitable pressure regulating means, including, but not limited to compressors, etc. Next, the pressurized, transport solution is directed to a fluid conduit having an input end and an opposed output end having a temperature regulating means positioned thereon for regulating the temperature of the solution at the output end. The output end of the conduit further comprises an outlet port oriented to direct the fluid in the conduit into the region and in the direction of the substrate. The outlet port can be of a shape similar to a nozzle or restrictor as used in other spraying and atomizing applications. Thereafter, the solution is heated using the temperature regulating means to a second selected temperature within 50° C. above or below the critical temperature, $T_c$, of the solution while maintaining the third selected pressure above the second selected pressure and above the corresponding liquidus or critical pressure, $P_c$, of the solution at the second selected temperature using the pressure regulating means. Then, the pressurized, heated solution is directed through the outlet port of the conduit into the region to produce a nebulized solution spray in the direction of the substrate. As the solution is directed into the region, one or more selected gases are admixed into the nebulized solution spray to form a reactable spray and, thereafter, this reactable spray is exposed to an energy source at a selected energization point. The energy source provides sufficient energy to react the reactable spray (which contains the one or more reagents of the transport solutions) thereby forming the material and coating the substrate therewith.

In a further embodiment of this method, the energy source comprises a flame source and the selected energization point comprises an ignition point. In an alternate embodiment, The energy source comprises a plasma torch and heated gasses.

In a further embodiment of the method, the second selected pressure of the region is ambient pressure.

In yet another embodiment, the nebulized solution spray is a vapor or an aerosol having a maximum droplet size of less than 2 μm.

In a further embodiment, the second selected pressure of the region is reduced to produce a combustion flame having a temperature of less than 1000° C.

In yet another embodiment, the carrier is propane and the transport solution comprises at least 50 % by volume propane. In a further embodiment, the transport solution further includes butanol, methanol, isopropanol, toluene, or a combination thereof. In yet another embodiment, the carrier is selected such that the transport solution is substantially precipitate free at standard temperature and pressure for a period of time sufficient to carry out the method.

In an alternate embodiment of the method, a pressurized container is used and before, during or after the pressuring step, a standard temperature and pressure gas is also contacted with the transport solution at a selected pressure sufficient to form a liquid or supercritical fluid (depending upon the temperature). In a preferred embodiment, the transport solution containing the standard temperature and pressure gas is substantially precipitate free at the selected pressure for a period of time sufficient to carry out the method. In yet another embodiment, the reagent concentration of the transport solution is between 0.0005 M and 0.05 M.

In a further embodiment, the outlet end of the conduit further comprises a fluid introduction port and, prior to directing the pressurized, heated solution through the outlet port of the conduit, fluid is added to the pressurized, heated solution through the fluid introduction port. Such introduction forms a combined solution having a reduced supercritical temperature.

In yet another embodiment, each of the one or more reagents has a vapor pressure of no less than about 25% of the vapor pressure of the carrier.

In a further embodiment, the outlet end of the conduit comprises tubing having an internal diameter of 2 to 1000 μm, more preferably 10 to 250 μm. In a more preferable embodiment, the outlet end of the conduit comprises tubing having an internal diameter of 25 to 125 μm. In yet a further preferable embodiment, the outlet end of the conduit comprises tubing having an internal diameter of 50 to 100 μm.

In another embodiment, the temperature regulating means comprises means for resistively heating the conduit by applying thereto an electric current of a selected voltage from an electric current source. In a preferred embodiment, the voltage is less than 115 Volts. In yet another preferred embodiment, the means for resistively heating the conduit comprises a contact positioned within 4 mm of the outlet port.

Moreover, the present invention also provides the above method wherein the carrier and one or more reagents are selected such that the second selected temperature is ambient temperature.

The above method may be practiced wherein the material that coats the substrate comprises a metal, a metal or metalloid oxide, or a mixture of a metal with a metal or metalloid oxide.

In a further embodiment, the reactable spray comprises a combustible spray having a combustible spray velocity and wherein the combustible spray velocity is greater than the flame speed of the flame source at the ignition point and further comprising one or more ignition assistance means for igniting the combustible spray. In a preferred embodiment, each of the one or more ignition assistance means comprises a pilot light. In yet another embodiment, the combustible spray velocity is greater than mach one.

In a her embodiment, the ignition point or flame front is maintained within 2 cm. of the outlet port.

The present invention also provides a method where, during the exposing step, cooling the substrate using a substrate cooling means. In a preferred embodiment, the substrate cooling means comprises a means for directing water onto the substrate. However, one of ordinary skill in the art would recognize that many other suitable cooling means could be used.

In a further embodiment, the material that coats the substrate has a thickness of less than 500 nm. In yet another embodiment, the material that coats the substrate comprises a graded composition. In another embodiment, the material that coats the substrate comprises an amorphous material. In a further embodiment, the material that coats the substrate comprises a nitride, carbide, boride, metal or other non-oxygen containing material.

The present invention also provides a method further comprising flowing a selected sheath gas around the reactable spray thereby decreasing entrained impurities and maintaining a favorable deposition environment.

In a preferred embodiment, the second selected pressure is above 20 torr.

Figures 2, 3:
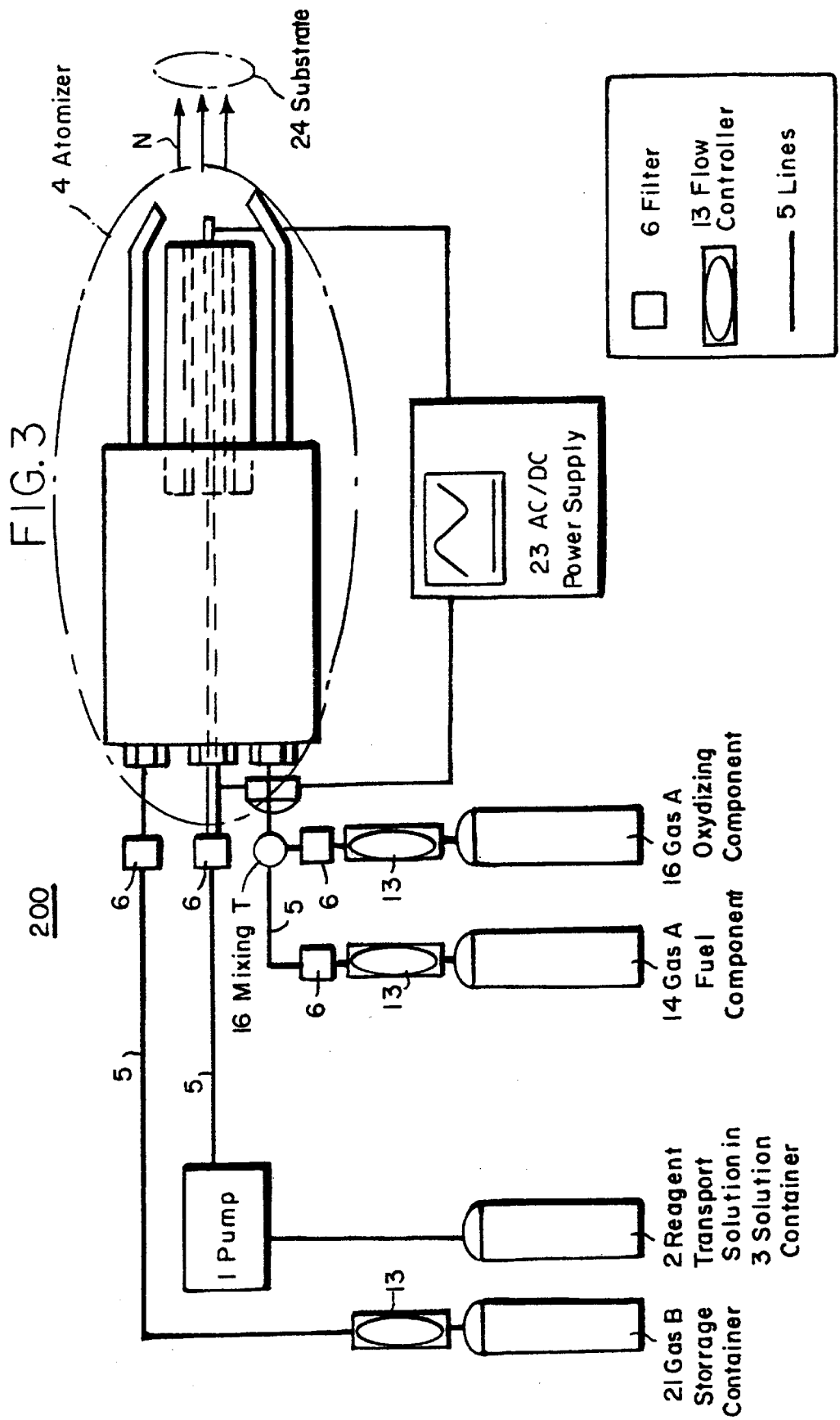
FIG. 2 shows a schematic diagram of an apparatus for the deposition of films and powders using near supercritical and supercritical atomization.
FIG. 3 shows a detailed schematic view of the atomizer used in the present invention.
Figure 3:
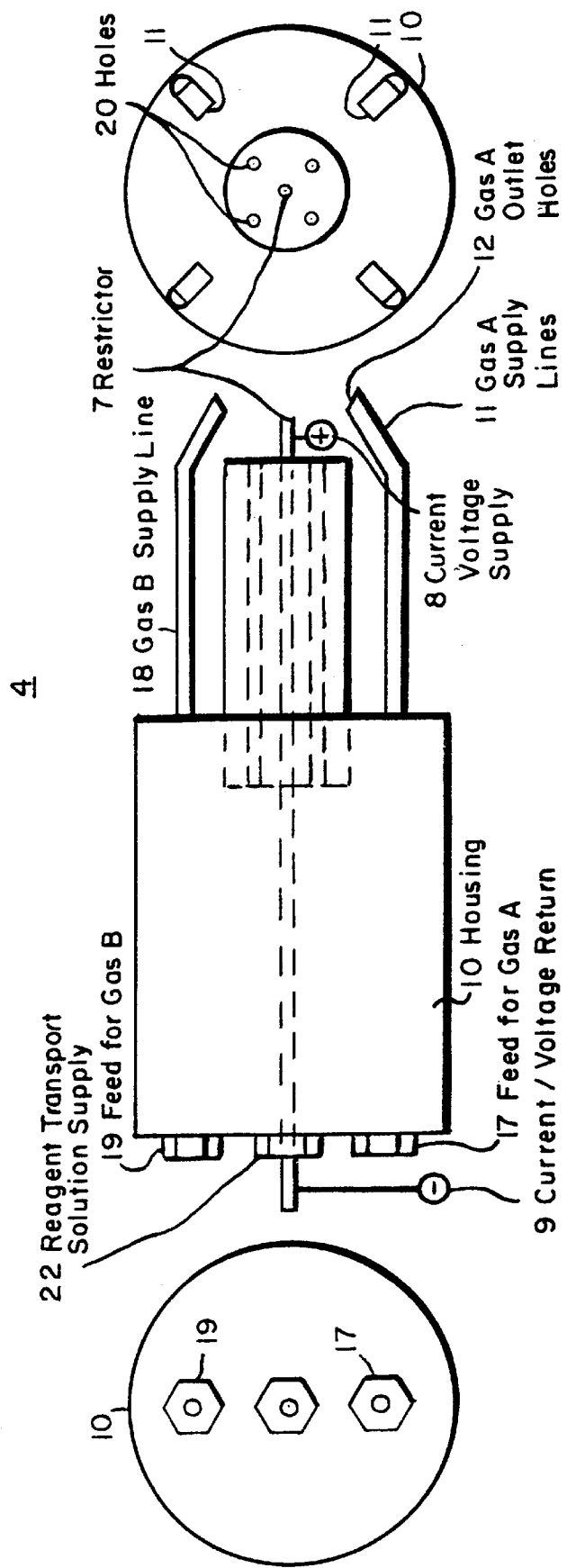

Referring now to FIG. 1, the preferred apparatus 100 comprises a pressure regulating means 110, such as a pump, for pressurizing to a first selected pressure a transport solution T (also called "precursor solution") in a transport solution reservoir 112, wherein the transport solution T comprises a suitable carrier having dissolved therein one or more reagents capable of reacting to form the selected material and wherein the means for pressurizing 110 is capable of maintaining the first selected pressure above the corresponding liquidus (if the temperature is below $T_c$) or critical pressure, $P_c$, of the transport solution T at the temperature of the transport solution T, a fluid conduit 120 having an input end 122 in fluid connection with the transport solution reservoir 112 and an opposed output end 124 having an outlet port 126 oriented to direct the fluid in the conduit 120 into a region 130 of a second selected pressure below the first selected pressure and in the direction of the substrate 140, wherein the outlet port 126 further comprises means 128 (see FIGS. 2 and 3, atomizer 4) for nebulizing a solution to form a nebulized solution spray N, a temperature regulating means 150 positioned in thermal connection with the output end 124 of the fluid conduit 120 for regulating the temperature of the solution at the output end 124 within 50° C. above or below the supercritical temperature, $T_c$, of the solution, a gas supply means 160 for admixing one or more gases (e.g., oxygen) (not shown) into the nebulized solution spray N to form a reactable spray, an energy source 170 at a selected energization point 172 for reacting the reactable spray whereby the energy source 170 provides sufficient energy to react the reactable spray in the region 130 of the second selected pressure thereby coating the substrate 140.

In a further embodiment of the apparatus, the energy source 170 comprises a flame source and the selected energization point 172 comprises an ignition point. In an alternate embodiment, the energy source 170 comprises a plasma torch. In yet another embodiment, the outlet port 126 further comprises a pressure restriction (see FIG. 3, restrictor 7).

In a further embodiment of the apparatus, the second selected pressure of the region is ambient pressure.

In yet another embodiment, the nebulized solution spray N is a vapor or an aerosol having a maximum droplet size of less than 2 μm.

In a further embodiment, the second selected pressure of the region is reduced to produce a combustion flame having a temperature of less than 1000° C.

In yet another embodiment, the carrier is propane and the transport solution comprises at least 50% by volume propane. In a further embodiment, the transport solution further includes butanol, methanol, isopropanol, toluene, or a combination thereof In yet another embodiment, the carrier is selected such that the transport solution is substantially precipitate free at standard temperature and pressure for a period of time sufficient to carry out the method.

In an alternate embodiment of the apparatus, a pressurized container (not shown) is provided and a standard temperature and pressure gas is also contacted with the transport solution at a selected pressure sufficient to form a liquid or supercritical fluid. In a preferred embodiment, the transport solution containing the standard temperature and pressure gas is substantially precipitate free at the selected pressure for a period of time sufficient to carry out the method. In yet another embodiment, the reagent concentration of the transport solution is between 0.0005 M and 0.05 M.

In a further embodiment, the outlet end 124 of the conduit 120 further comprises a fluid introduction port (see FIG. 2, feed lines 17 or 19) and, prior to directing the pressurized, heated solution through the outlet port 126 of the conduit 120, fluid is added to the pressurized, heated solution through the fluid introduction port. Such introduction forms a combined solution having a reduced supercritical temperature.

In yet another embodiment, each of the one or more reagents has a vapor pressure of no less than about 25% of the vapor pressure of the carrier.

In a further embodiment, the outlet end of the conduit comprises tubing having an internal diameter of 2 to 1000 μm, more preferably 10 to 250 μm. In a more preferable embodiment, the outlet end of the conduit comprises tubing having an internal diameter of 25 to 125 μm. In yet a further preferable embodiment, the outlet end of the conduit comprises tubing having an internal diameter of 50 to 100 μm.

In another embodiment, the temperature regulating means 150 comprises means for resistively heating the conduit by applying thereto an electric current of a selected voltage from an electric current source. In a preferred embodiment, the voltage is less than 115 Volts. In yet another preferred embodiment, the means for resistively heating the conduit comprises a contact 152 positioned within 4 mm of the outlet port 126.

Moreover, it is provided that the above apparatus is utilized wherein the carrier and one or more reagents are selected such that the second selected temperature is ambient temperature.

The above apparatus may be used wherein the material that coats the substrate 140 comprises a metal. Alternatively, the material that coats the substrate 140 comprises one or more metal oxides. In yet a further embodiment, the material that coats the substrate 140 comprises at least 90% silica.

In a further embodiment, the reactable spray comprises a combustible spray having a combustible spray velocity and wherein the combustible spray velocity is greater than the flame speed of the flame source at the ignition point 172 and further comprising one or more ignition assistance means 180 for igniting the combustible spray. In a preferred embodiment, each of the one or more ignition assistance means 180 comprises a pilot light. In yet another embodiment, the combustible spray velocity is greater than mach one.

In a further embodiment, the ignition point 172 or flame front is maintained within 2 cm. of the outlet port.

The present invention also provides a substrate cooling means 190 for cooling the substrate 140. In a preferred embodiment, the substrate cooling means 190 comprises a means for directing water onto the substrate 140. However, one of ordinary skill in the art would recognize that many other suitable cooling means could be used.

In a further embodiment, the material that coats the substrate 140 has a thickness of less than 500 nm. In yet another embodiment, the material that coats the substrate 140 comprises a graded composition.

There is further an apparatus provided comprising a means (see FIGS. 2 and 3, feed line 17 or 19) for flowing a selected sheath gas around the reactable spray thereby decreasing entrained impurities and maintaining a favorable deposition environment.

In a preferred embodiment, the second selected pressure is above 20 torr.

In a further embodiment of the method, the energy source comprises a flame source and the selected energization point comprises an ignition point. In an alternate embodiment, the energy source comprises a plasma torch, hot gasses, etc.

In a further preferred embodiment of the powder forming method, the transport solution concentration is between 0.005 M and 5 M.

To simplify the operation, it is helpful to pump the precursor/solvent solution to the atomizing device at room temperature. Heating of the solution should occur as a final step just prior to release of the solution into the lower pressure region. Such late stage heating minimizes reactions and immiscibilities which occur at higher temperatures. Keeping the solution below the supercritical temperature until atomization maintains the dissolved amounts of precursor in the region of normal solubility and reduces the potential of developing significant solvent-precursor concentration gradients in the solution. These solubility gradients are a result of the sensitivity of the solution strength of a supercritical solvent with pressure. Small pressure gradients (as they can develop along the precursor-solvent system delivery) can lead to significant changes in solubility as has been observed. For instance, the solubility of acridine in carbon dioxide at 308° K. can be increased 1000 times by increasing the pressure from 75 atm to 85 atm. See V. Krukonis, "Supercritical Fluid Nucleation of Difficult to Comminute Solids", Presented at AIChE Meeting, San Francisco, Nov. 25–30, 1984 Such solubility changes are potentially detrimental because they may cause the precursor to be driven out of solution and precipitate or react prematurely, clogging lines and filters.

The rapid drop in pressure and the high velocity at the nozzle cause the solution to expand and atomize. For solute concentrations in the normal solubility range, preferred for operation of the near supercritical atomization system of the present invention, the precursors are effectively still in solution after being injected into the low pressure region. The term "effectively in solution" must be understood in conjunction with processes taking place when a solution with solute concentrations above the normal solvent strength is injected into the low pressure region. In this case, the sudden pressure drop causes high supersaturation ratios responsible for catastrophic solute nucleation conditions. If the catastrophic nucleation rapidly depletes the solvent from all dissolved precursor, the proliferation of small precursor particles is enhanced. See D. W. Matson, J. L. Fulton, R. C. Petersen and R. D. Smith, "Rapid Expansion of Supercritical Fluid Solutions: Solute Formation of Powders, Thin Films, and Fibers", Ind. Eng. Chem. Res., 26, 2298 (1987); H. Anderson, T. T. Kodas and D. M. Smith, "Vapor Phase Processing of Powders: Plasma Synthesis and Aerosol Decomposition", Am. Ceram. Soc. Bull., 68, 996 (1989); C. J. Chang and A. D. Randolph, "Precipitation of Microsize Organic Particles from Supercritical Fluids", AIChE Journal, 35, 1876 (1989); T. T. Kodas, "Generation of Complex Metal Oxides by aerosol Processes: Superconducting Ceramic Particles and Films", Adv. Mater., 6, 180 (1989); E. Matijevic, "Fine Particles: Science ad Technology", MRS Bulletin, 14, 18 (1989); E. Matijevic, "Fine Particles Part II: Formation Mechanisms and Applications", MRS Bulletin, 15, 16 (1990); R. S. Mohamed, D. S. Haverson, P. G. Debenedetti and R. K. Prud'homme, "Solid Formation After Expansion of Supercritical Mixtures," in Supercritical Fluid Science and Technology, edited by K. P. Johnston and J. M. L. Penniger, p.355, American Chemical Society, Washington, DC (1989); R. S. Mohamed, P. G. Debenedetti and R. K. Prud'homme, "Effects of Process Conditions on Crystals Obtained from Supercritical Mixtures", AIChE J., 35, 325 (1989); J. W. Tom and P. G. Debenedetti, "Formation of Bioerodible Polymeric Microspheres and Microparticles by Rapid Expansion of Supercritical Solutions", Biotechnol. Prog., 7, 403 (1991). Particles are undesirable for the formation of thin coatings, but can be beneficial during the formation of powders.

Thus the heated atomizer provides the further superior advantages, compared to an unheated device that operates on rapid expansion of a solvent at exclusively above the supercritical temperature, that (1) the temperature allows for a well controlled degree of atomization of the precursor-solvent mixture and (2) catastrophic nucleation of the precursors can be omitted while still enjoying the benefits of supercritical atomization. Supersonic velocities can be created forming a mach disk which additionally benefits atomization. Addition of gasses to the released atomized materials aids in directing the flow and can ensure a desired mixture for combustion.

By adjusting the heat input into the atomizing device, the liquid solution can be vaporized to various degrees. With no heat input to the atomizing device, liquid solutions of higher supercritical temperature liquids, that are liquids at STP, can exit in the form of a liquid stream which is clearly far from a supercritical condition. This results in a poorly formed flame and, possibly, undesirable liquid contact with the substrate. Decreasing the temperature differential of the liquid solution to its supercritical temperature at the nozzle causes the liquid solution to break up into droplets forming a mist which is released from the atomizing device. The droplets vaporize, and thus become invisible, after a short distance. As the supercritical temperature at the atomizing device is approached, the liquid solution droplets decrease in size, and the distance to solution vaporization is decreased. Using this atomizer the vapor droplet size was determined using an laser aerosol particle size tester and the obtained droplet size was below the 1.8 $\mu$m detection limit of the instrument.

Further increasing the heat input results in a state of no mist at the tip, or complete vaporization. Without wishing to be bound by theory, this behavior of the solution can be attributed to the combined supercritical properties of the reagents and solvents. Solutions of precursors in lower supercritical temperature solvents, that are gasses at STP, behave similarly, but the emerging solution from the tip (also referred to as the "nozzle" or "restrictor") does not form a liquid stream, even without heat input. The amount of heat needed to obtain optimal vaporization of the solution depends mostly on the heat capacity of the solution and the differential between the supercritical temperature of the solvent and the ambient temperature around the nozzle.

It is desirable to maintain the pressure and temperature of the system (before vaporization) above the boiling and the supercritical point of the solution. If the pressure falls below the liquidus or critical pressure, coincident with the temperature above the boiling point, vaporization of the solvents will occur in the tube prior to the tip. This leaves the solutes which can build up and clog the atomizing device. Similarly the pressure is preferably sufficiently high in the supercritical region so that the fluid is more liquid-like. Liquid-like supercritical fluids are better solvents than more gas-like supercritical fluids, further reducing the probability of solutes clogging the atomizing device. If the precursor-to-precursor interaction is higher than the strength between solvent and precursor, the solvent-precursor bonds can be broken and effectively drive the precursor out of solution. Precursor molecules then form clusters that adhere to the atomizing device and clog the restrictor. The problem can be solved, in most cases, by shifting the vaporization point from the inside of the tip to the end of the tip, which is accomplished by reducing the heat input into the atomizing device. Another solution is to use a solvent which forms stronger bonds with the precursor so a more stable solution is formed. A small amount of mist at the tip usually results in the best quality thin films. Nano- or microspheres of the material will form if the temperature of the solution it too high or too low. These spheres are detrimental if dense coatings are desired.

If the no-mist condition is reached, the deposition is being performed above the critical temperature. The heat of the flame and mixing with external gasses keeps STP liquid solvents from condensing and forming droplets. In the no-mist instance, atomization and intermixing is very good but flow stability is reduced, resulting in a flame that can jump from side to side with respect to the direction of the tip. With such a flame behavior, depositions remain possible, but it can be difficult to deposit films requiring stringent thickness uniformity. Additionally, it is necessary to maintain the temperature of the solution, prior to release, below the temperature where either the solute precipitates or reacts and precipitates. When using a solvent mixture it may be possible during heating to cross the line for spinoidal immiscibility. This causes the formation of two separate phases, with the possibility of concentration differences in the two phases due to different solubilities of the solutes. This may influence the formation of precursor and product spheres at high atomization temperatures. All of these factors demonstrate the preferability of minimizing the solution's exposure to heating, if necessary, until the tip so that possible unwanted equilibrium condition states of matter do not have sufficient time to transpire. The structure of the films deposited can thus be precisely controlled.

Due to this control, a number of film microstructures are possible. By increasing solution concentration it is possible to increase the deposition rate and the following microstructural changes result with increasing solution concentration; dense to porous, specular to dull, smooth to rough, columnar to hillocks, and thin to thick. Graded and multilayered coatings can also be produced. Multilayers can be formed by supplying different precursor containing solutions to an individual flame. Sequential multiple deposition flames may be used to increase throughput for production applications. Some additional factors controlling deposition parameters include; substrate surface temperature which controls surface diffusion and nucleation; pressure which controls boundary layer thickness and thus deposition rate, solution composition and mix gasses varies the material being deposited and thus the coatings growth habit, flame and plasma energy level effects where the reaction occurs and vapor stability, and the distance to the substrate effects the time from nebulization to reaction to deposition which can lead to particle formation or increased diffusion time for larger clusters. Additionally, electric and magnetic fields affect the growth habits of some materials, or increase deposition efficiency. One of ordinary skill in the art would recognize that such electric and magnetic fields will affect the growth habits of some vapor deposited materials, as well as vary the particular deposition rate and efficiency.

Because the required energy input into the solution heating atomizer varies for different precursor/primary-solvent/secondary-solvent solutions, it is preferred to deposit multilayer thin films from solutions with constant primary to secondary solvent ratios. In so doing, it is not necessary to change the energy input to the atomizer when switching from one solution to another solution. The resulting simplification of the setup produces increased performance and reliability while reducing costs. Alternatively, the substrate can be passed by flames containing different reagents to build the desired multilayer.

When the solution provides the fuel for combustion, concentrations up to 0.1 molar result in dense coatings depending on the material. Most materials have preferred concentrations of up to 0.01 molar. Materials with lower diffusion and mobility need solution concentrations of less than 0.002. Solution concentrations of less than 0.0001 molar result in very slow deposition rates for most materials. Flame depositions with added combustible materials can have higher concentrations, even exceeding 1 M, but for the preferable vapor formation of the precursors, high concentrations are less desirable unless the precursor(s) have high vapor pressures. Low vapor pressure precursor solution concentrations are preferably less than 0.002 molar.

Without wishing to be bound by theory, it is helpful to understand that the principle of the deposition technique of the present invention involves the finding that CVD its not limited to reactions at the surface. See Hunt, A. T., "Combustion Chemical Vapor Deposition, a Novel Thin Film Deposition Technique", Ph.D. Thesis Georgia Inst. of Tech, Atlanta, Ga., (1993); Hunt, A. T., "Presubstrate Reaction CVD, and a Definition for Vapor", presented at the 13th Int. Conf. on CVD, Los Angles, Calif. (1996), the contents of which are hereby incorporated by this reference. Reactions can occur predominately in the gas stream, but the resulting material which is deposited must be subcritical in size to yield a coating with vapor deposited microstructures. These observations demonstrate that a vapor is composed of individual atoms, molecules or nanoclusters which can be absorbed onto a substrate and readily diffused into lower energy sites or configurations. Thus the maximum cluster size must decrease with lower substrate temperatures as does the critical nucleus size. It is known by one of ordinary skill in the art that reagent clusters are left after vaporization of the solvents, and the cluster size is related to the reagent vapor pressure, initial droplet size and the solution concentration. Therefore, atomization of low vapor pressure reagents, which therefore do not gasify in the flame, must be very fine to form vapor.

Preferred liquid solvents are low cost solvents include, but are not limited to, ethanol, methanol, water, isopropanol and toluene. Water solutions must be fed into a preexisting flame, while the combustible solvents can themselves be used to form the flame. It is preferable, but not required, to form the bulk of the flame using the solution rather than feeding the solution into a flame. Lower reagent concentration results this way, which eases the formation of subcritical nucleus sized materials.

One preferred solvent and secondary solution fluid which is propane, which is a gas at STP. However, it must be noted that many other solvent systems are operable. See, e.g., *CRC*

*Handbook of Chemistry and Physics*, CRC Press, Boca Raton, Florida Propane is preferred because of its low cost, its commercial availability, and its safety. Many low cost organometalics can be used in a predominately propane solution. To ease handling, the initial precursors can be dissolved in methanol, isopropanol, toluene or other solvents compatible with propane. This initial solution is then placed into a container into which liquid propane is added. Propane is a liquid at above only about 100 psi at room temperatures. The resulting solution has a much lower supercritical point than the initial solution which eases atomization by lowering the required energy input into the atomizer. Additionally, the primary solvent acts to increase the polar solubility of the propane, thus allowing higher solution concentrations for many reagents than would otherwise be achieved by propane alone. As a general rule, the polarity of the primary solvent should increase with increasing polarity of the solute (precursor). Isopropanol can thus aid in the solubility of a polar solute better than toluene. In some cases the primary solvent acts as a shield between the secondary solvent and a ligand on the solute. One example is the dissolution of platinum-acetylacetonate [Pt($CH_3COCHCOCH_3$)$_2$] in propane, where the weight ratios between precursor/primary solvent and primary solvent/secondary solvent can be higher than those required in other systems.

Ammonia has been considered and tested as a secondary solvent for the deposition of coatings and powders. While ammonia is an inexpensive solvent that is compatible with some nitrate based precursors, it is not easily usable with other secondary solvents and problems stem from the general aggressiveness of pure ammonia. The atomization properties of ammonia were tested without the addition of a precursor and the used pressure vessel was significantly attacked after the experiment even when an inert Type-316 stainless steel vessel was used. In contrast to hydrocarbon based solvents, ammonia also renders Buna-N and Viton gaskets useless after only a few minutes. Even with a suitable gasket material this is a problem since the desired coatings or powders usually must not contain traces of iron or other elements leached from the pressure vessel wall. However, there are materials, such as EPDM elastomer which may be used. Ni has been deposited from a ammonia-water mix with Ni-amine-nitrate formed precursor.

Other gas-like secondary solvents that were tested and can be used include ethane, ethylene, ethane/ethylene mixture, propane/ethylene mixture, and propane/ethane mixture. Platinum thin films were deposited from a supercritical mixture of ethane and a platinum metalorganic.

Other tested solvents and solvent mixtures resulted in similar quality, but were more complex to work with since their boiling points are significantly lower, which required cooling of the solution or very high pressures. The ease of handling makes propane the preferred solvent but the other supercritical solvents are considered alternatives to propane in cases where propane cannot be used, such as when a precursor that is soluble in propane cannot be found. Other fluids can be used to further reduce the supercritical temperature if desired.

One heating method is the application of an electric current between the nozzle end, where the precursor solution is injected into the low pressure region, and the back of the restriction tube. This directly heated restrictive tube method allows for fast changes in atomization due to a short response time. The location of most intense heating can be shifted toward the tip by increasing the connection resistance between the tip and the electrical lead connected to the tip. Thin walled restriction tubes possess a larger resistance than thick walled tubes and decrease the response time. Other heating methods can be applied and several have been investigated, including but not limited to, remote resistive heating, pilot flame heating, inductive heating and laser heating. One of ordinary skill in the art could readily determine other suitable heating means for regulating the temperature at the outlet port of the atomizer.

Remote resistive heating uses a non-conducting restriction tube that is located inside an electrically heated tube. The non-conducting tube will fit tightly into the conductive tube. Application of an electric current to the conductive type heats that tube and energy is transferred into the inner, non-conductive restriction tube. This method requires larger heating currents compared to the directly-heated restrictive tube method and shows longer response times, which can be advantageous under certain conditions since the increased response time results in a high degree of thermal stability. On the other hand, pilot flame and laser heating use the energy of the pilot flame or laser light, respectively, to heat the restriction tube. This can be done in a directly heated setup where the tip of the restriction tube is subjected to the pilot flame or laser light or in an indirectly heated configuration where the larger outer tube is heated. Because the amount of energy that needs to be transferred into the solution is quite large, the heated tube will, preferably, have a thicker wall than in the case of direct electrical heating or remote electrical heating. Subjecting an outer tube to the pilot flame or laser light allows the use of a thin walled restriction tube.

Referring now to FIGS. 2 and 3, an apparatus 200 for the deposition of films and powders using supercritical atomization is shown. The apparatus 200 consists of a fixed or variable speed pump 1 that pumps the reagent transport solution 2 (also called "precursor solution") from the solution container 3 into the atomizer (also referred to as the "nebulizer" or "vaporizer") 4. FIG. 3 is an inset view showing a more detailed schematic view of the atomizer 4. The precursor solution 2 is pumped from the precursor solution container 3 through lines 5 and filters 6 and into the atomizer 4. The precursor solution 2 is then pumped into a constant or variable temperature controlled restrictor 7. Heating can be accomplished in many ways including, but not limited to, resistive electrical heating, laser heating, inductive heating, or flame heating. For resistive electrical heating, either AC or DC current can be used. One of the electrical connections 8 to the restrictor 7 is preferably placed very close to the tip of the restrictor 7. In the case of heating by a DC source, this connection 8 or pole can be either positive or negative. The other pole 9 can be connected at any other point along the restrictor 7, inside or outside the housing 10. For special applications such as coating the inside of tubes, where a small total atomizer size is advantageous, it is preferable to either connect to the restrictor 7 at the back of the housing 10 or to connect inside the housing 10. Gas connections at the back of the housing 10 are shown in an on-line arrangement but can be placed in any other arrangement that does not interfere with the function of the apparatus 200. The thin gas A supply line 11, 1/16" ID in most cases, carries a combustible gas mix to a small outlet 12 where it can serve as a stable pilot flame, preferably within 2.5 cm of the restrictor 7, for the combustion of the precursor solutions supplied via the restrictor 7. Gas A supply is monitored by a flow controller 13, controlling the flow of the individual gas A mix components, 14 and 15. The gas A fuel component 14 is mixed with the oxidizing component 15 in a mixing "T" 16 close to or inside the atomizer 4. This late mixing is preferably for safety reasons because it reduces potential flash-back. Distribution channels inside the housing 10 connect the gas supply lines 11 to the gas A feed 17. Gas B supply lines 18 are used to deliver gas B from the supply 19 such that good mixing with the nebulized solutions spray can be accomplished. In most cases a high velocity gas stream is utilized. A number of gas B supply holes 20 (six for most cases, more or less holes can be used depending on the particular application) is placed around the restrictor 7 supplying gas B such that the desired flow pattern is obtained. The flow properties of the gas B stream are influenced by such factors as gas B pressure in the gas B storage container 21, flow rate as determined by the flow controller 13, line diameters 5, and number of supply holes 20. Alternatively, gas B can be fed through a larger tube coaxial to and surrounding the restrictor 7. Once the precursor solution 2 has been pumped into the precursor supply 22 its temperature is controlled by the current flow (in the case of electrical heating) through the restrictor 7 as determined by the power supply 23. This heating current can then be adjusted such that the proper amount of atomization (nebulization, vaporization) can occur. The stable pilot flame is then capable of igniting the nebulized reactive spray and depositing a powder or film on a substrate 24.

Many different coatings have been deposited using the methods and apparatuses described herein. While propane was used in most cases as the super critical secondary solvent (i.e. a small amount of high precursor concentration primary solvent was mixed with a large amount of secondary solvent), others solvents have been used. Other possible secondary solvents include, but are not limited to $N_2O$, ethylene, ethane, and ammonia.

One of ordinary skill in the art would recognize that almost any substrate can be coated by the method and apparatus of the present invention. A substrate can be coated if it can withstand the temperature and conditions of the resulting hot gases produced during the process. Substrates can be cooled using a means for cooling (described elsewhere herein), such as a water jet, but at low substrate surface temperatures, dense or crystalline coatings of many materials are not possible because of the associated low diffusion rates. In addition, substrate stability in the hot gases can be further accounted for by using a low temperature, low pressure flame, either with or without additional substrate cooling.

A variety of chemical precursors have been suggested for CCVD deposition of films and powders, and additional chemical precursors are suggested herein. In addition to providing the metal or metalloid element, it is required of any chemical precursor for CCVD that it be soluble in a suitable carrier solvent, most desirably soluble in propane. Furthermore, if the precursor solution is to contain precursors of more than one metal and/or metalloid, the chemical precursors must be mutually soluble in a suitable carrier solvent and chemically compatible with each other. If a precursor is not highly soluble in a primary solvent, such as propane, it may be initially dissolved in a secondary solvent, such as toluene, and subsequently introduced into the primary solvent as a solution in the secondary solvent, providing that the chemical precursor does not precipitate when such a solution is introduced into the primary solvent. Furthermore, cost considerations enter into the choice of chemical precursor.

If a mixture of chemical precursors are to be provided for depositing a layer or powder of a particular composition, it is desirable that such precursors be combinable as a homogeneous "pre-solution" without the addition of any additional solvent. If not, it is desirable that all chemical precursors be mutually soluble in a common solvent, the less solvent the better, as a "pre-solution". These desired properties, of course, facilitate shipping and handling, particularly when the intended primary solvent is propane or another material which is gaseous at room temperature. Though desirable to be able to provide a "pre-solution", it is considered acceptable that the chemical precursors be mutually soluble in a deposition solution of one or more solvents and either be prepared and sold as such a solution or prepared on-site as a deposition solution.

For deposition, the total concentration of the precursor compounds in the carrier solvent is generally between about 0.001 and about 2.5 wt %, preferably between about 0.05 and about 1.0 wt %.

For most CCVD depositions, it is preferred that the precursors be dissolved in an organic solvent. However, for the capacitor materials to which the present invention is directed, it is undesirable that carbon co-deposits with the dielectric material. Next to the dielectric is the 2nd electrode. Some conductive materials, nickel, for example, have a high affinity for carbon. Accordingly, precursors for such materials may be preferably dissolved in an aqueous and/or ammonia solution, in which case, the aqueous and/or ammonia and/or $N_2O$ solution would be aspirated into a hydrogen/oxygen flame for CCVD.

One of the advantages of CCVD, as performed with preferred atomizing apparatus, relative to other deposition methods, is that the a precursor solution containing one or more dissolved chemical precursors is atomized as a near-super critical liquid or, in some cases, as a super critical fluid. Accordingly, the amount of precursor or precursors being burned and deposited on a substrate or deposited in powder form is independent of the relative vapor pressures of the individual chemical precursors and the carrier solvent or solvents. This is in contrast to conventional CVD processes where individual supply lines must be provided for each chemical precursor that is to be vaporized, generally within a carrier gas, for supply to a CVD furnace. Also, some conventional CVD precursors disproportionate, making it difficult to supply such a chemical precursor uniformly--another problem readily addressed by CCVD technology.

A Controlled Atmosphere Combustion Chemical Vapor Deposition (CACCVD) apparatus is illustrated in FIGS. 7 and 8. A coating precursor 710 is mixed with a liquid media 712 in a forming zone 714, comprising a mixing or holding tank 716. The precursor 710 and liquid media 712 are formed into a flowing stream which is pressurized by pump 718, filtered by filter 720 and fed through conduit 722 to an atomization zone 724, from which it flows successively through reaction zone 726, deposition zone 728 and barrier zone 730. It is not required that a true solution be formed from mixing the coating precursor 710 with the liquid media 712, provided the coating precursor is sufficiently finely divided in the liquid media. However, the formation of a solution is preferred, since, generally, such produces a more homogeneous coating.

The flowing stream is atomized as it passes into the atomization zone 724. Atomization can be accomplished by recognized techniques for atomizing a flowing liquid stream. In the illustrated apparatus, atomization is effected by discharging a high velocity atomizing gas stream surrounding and directly adjacent the flowing stream as it discharges from conduit 722. The atomizing gas stream is provided from a gas cylinder or other source of high pressure gas. In the illustrated embodiment, high pressure hydrogen ($H_2$) is used both as an atomizing gas and as a fuel. The atomizing gas is fed from hydrogen gas cylinder 732, through regulating valve 734, flowmeter 736 and into conduit 738. Conduit 738 extends concentrically with conduit 722 to the atomization zone where both conduits end allowing the high-velocity hydrogen atomizing gas to contact the flowing liquid stream thereby causing it to atomize into a stream of fine particles suspended in the surrounding gas/vapors. This stream flows into the reaction zone 726 wherein the liquid media vaporizes and the coating precursor reacts to form a reacted coating precursor, which often involves dissociation of the coating precursor into ions of its components and results in a flowing stream of ionic particles, or plasma. The flowing stream/plasma, passes to the deposition zone 728 wherein the reacted coating precursor contacts the substrate 740 depositing the coating thereon.

The flowing stream may be atomized by injecting the atomizing gas stream directly at the stream of liquid media/coating precursor as it exits conduit 722. Alternatively, atomization can be accomplished by directing ultrasonic or similar energy at the liquid stream as it exits conduit 722.

The vaporization of the liquid media and reaction of the coating precursor require substantial energy input to the flowing stream before it leaves the reaction zone. This energy input can occur as it passes through the conduit 722, or in the atomization and/or reaction zones. The energy input can be accomplished by a variety of known heating techniques, such as electrical resistance heating, microwave or RF heating, electrical induction heating, radiant heating, mixing the flowing stream with a remotely heated liquid or gas, photopic heating such as with a laser, etc. In the illustrated preferred embodiment, the energy input is accomplished by the combustion of a fuel and an oxidizer in direct contact with the flowing stream as it passes through the reaction zone. This relatively new technique, referred to as Combustion Chemical Vapor Deposition (CCVD), is more fully described in the incorporated U.S. Pat. No. 5,652,021. In the illustrated embodiment, the fuel, hydrogen, is fed from hydrogen gas cylinder 732, through a regulating valve, flowmeter 742 and into conduit 744. The oxidizer, oxygen, is fed from oxygen gas cylinder 746, through regulating valve 748 and flowmeter 750 to conduit 752. Conduit 752 extends about and concentric with conduit 744, which extends with and concentrically about conduits 722 and 738. Upon exiting their respective conduits, the hydrogen and oxygen combust creating combustion products which mix with the atomized liquid media and coating precursor in the reaction zone 726, thereby heating and causing vaporization of the liquid media and reaction of the coating precursor.

A curtain of a flowing inert gas provided around at least the initial portion of the reaction zone isolates the reactive gases from the materials present in the apparatus located in proximity to the reaction zone. An inert gas, such as argon, is fed from inert gas cylinder 754, through regulating valve 756 and flowmeter 758 to conduit 760. Conduit 760 extends about and concentric with conduit 752. Conduit 760 extends beyond the end of the other conduits 722, 738, 744 and 752, extending close to the substrate whereby it functions with the substrate 740 to define a deposition zone 728 where coating 762 is deposited on the substrate generally in the shape of the cross-section of conduit 760. As the inert gas flows past the end of oxygen conduit 752, it initially forms a flowing curtain which extends about the reaction zone, shielding the reactive components therein from conduit 760. As it progresses down the conduit 760, the inert gas mixes with the gases/plasma from the reaction zone and becomes part of the flowing stream directed to the deposition zone 728.

An ignition source is needed to initially ignite the hydrogen and oxygen. A separate manually manipulated lighting or ignition device is sufficient for many applications, however the use of such may require a temporary reduction in the flow of inert gas until a stable flame front is established. In some applications, the total flow of gas may be too great to establish an unassisted stable flame front. In such case, it is necessary to provide an ignition device capable of continuously or semi-continuously igniting the combustible gases as they enter the reaction zone. A pilot flame or a spark producing device are exemplary ignition sources which may be employed.

In the deposition zone 728, the reacted coating precursor deposits coating 762 on the substrate 740. The remainder of the flowing stream flows from the deposition zone through a barrier zone 730 to discharge into the surrounding, or ambient, atmosphere. The barrier zone 730 functions to prevent contamination of the deposition zone by components of the ambient atmosphere. The high velocity of the flowing stream as it passes through the barrier zone 730 is a characteristic feature of this zone. By requiring that the flowing stream achieve a velocity of at least fifty feet per minute as it passes through the barrier zone, the possibility of contamination of the deposition zone by components of the ambient atmosphere is substantially eliminated in most coating applications. By requiring that the flowing stream achieve a velocity of at least one hundred feet per minute the possibility of ambient atmosphere contamination of the deposition zone is essentially eliminated in those coating operations which are more highly contamination sensitive, such as the production of TiN or WC.

Figure 7:
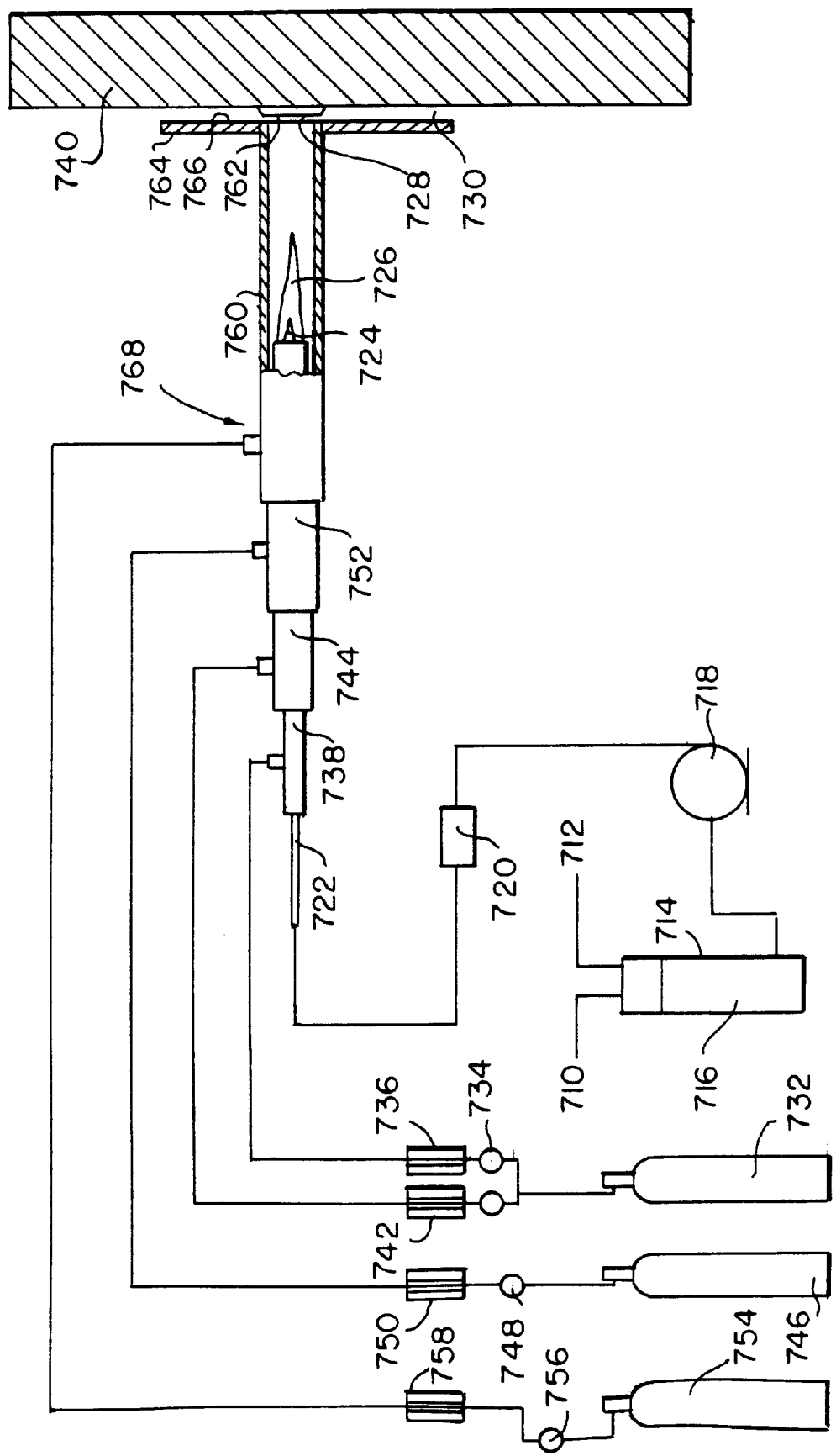
FIG. 7 is a schematic view, partially in section, of an apparatus for applying coatings in accord with the present invention.

In the embodiment of FIG. 7, a collar 764 is attached to and extends perpendicularly outward from the end of conduit 760 adjacent deposition zone 728. The barrier zone 730 is defined between the collar 764 and the substrate 740. The collar is shaped to provide a conforming surface 766 deployed close to the surface of the substrate whereby a relatively small clearance is provided for the exhaust of gases passing from the deposition zone to the ambient atmosphere. The clearance established between the conforming surface 764 of the collar and the substrate is sufficiently small that the exhaust gases are required to achieve the velocity required in the barrier zone for at least a portion of their passage between the collar and the substrate. To this end, the conforming surface 764 of the collar 762 is shaped to lie essentially parallel to the surface of the substrate 740. When the surface of the substrate 740 is essentially planar, as it is in the illustrated embodiment, the conforming surface of the substrate is also substantially planar.

Edge effects, such as elevated temperatures and residual reactive components, which occur adjacent the end of the conduit 760 can extend the deposition zone beyond the area of the substrate directly in front of the end of conduit 760. The collar 764 should extend outward from its joinder to the conduit 760 a sufficient distance to preclude the back-mixing of ambient gases into the deposition zone due to a possible Venturi effect, and to assure that the entire area of the deposition zone, as it is extended by the previously noted edge effects, is protected from the backflow of ambient gases by the high velocity exhaust gases sweeping through the area between the collar and the substrate. The extended collar assures that contamination is prevented throughout the extended deposition zone. The diameter of the collar should be at least twice the internal diameter of conduit 760, and preferably, should be at least five times the internal diameter of conduit 760. The internal diameter of conduit 760 typically is in the range of 10 to 30 millimeters, and preferably is between 12 and 20 millimeters.

In operation, the collar 764 is located substantially parallel to the surface of the substrate 740 being coated and at a distance therefrom of 1 centimeter or less. Preferably, the facing surfaces of the collar and the substrate are between 2 and 5 millimeters apart. Spacing devices, such as three fixed or adjustable pins (not shown), may be provided on the collar to assist in maintaining the proper distance between the collar and the substrate.

The embodiment illustrated in FIG. 7 is particularly advantageous for applying coatings to substrates which are too large, or for which it is not convenient, to be treated in a specially controlled environment such as a vacuum chamber or a clean room. The illustrated coating technique is advantageous because it can be accomplished under atmospheric pressure conditions and at more convenient "in the field" locations. The series of concentric conduits 722, 738, 744, 752 and 760 form a coating head 768 which can be supplied by relatively small flexible tubes and can be sufficiently small to be portable. Large substrates can be coated either by having the coating head traverse the substrate repeatedly in a raster or similar pattern, or by traversing the substrate with an array of coating heads arranged to cumulatively provide a uniform coating, or by rastering an array of coating heads. In addition to permitting the thin film coating of articles which previously were too large to be coated, this technique permits the coating of larger units of those substrates which previously were coated under vacuum conditions. Manufacturing economies can be achieved by coating larger units of these substrates, especially when mass production of the substrates is involved.

Figure 8:
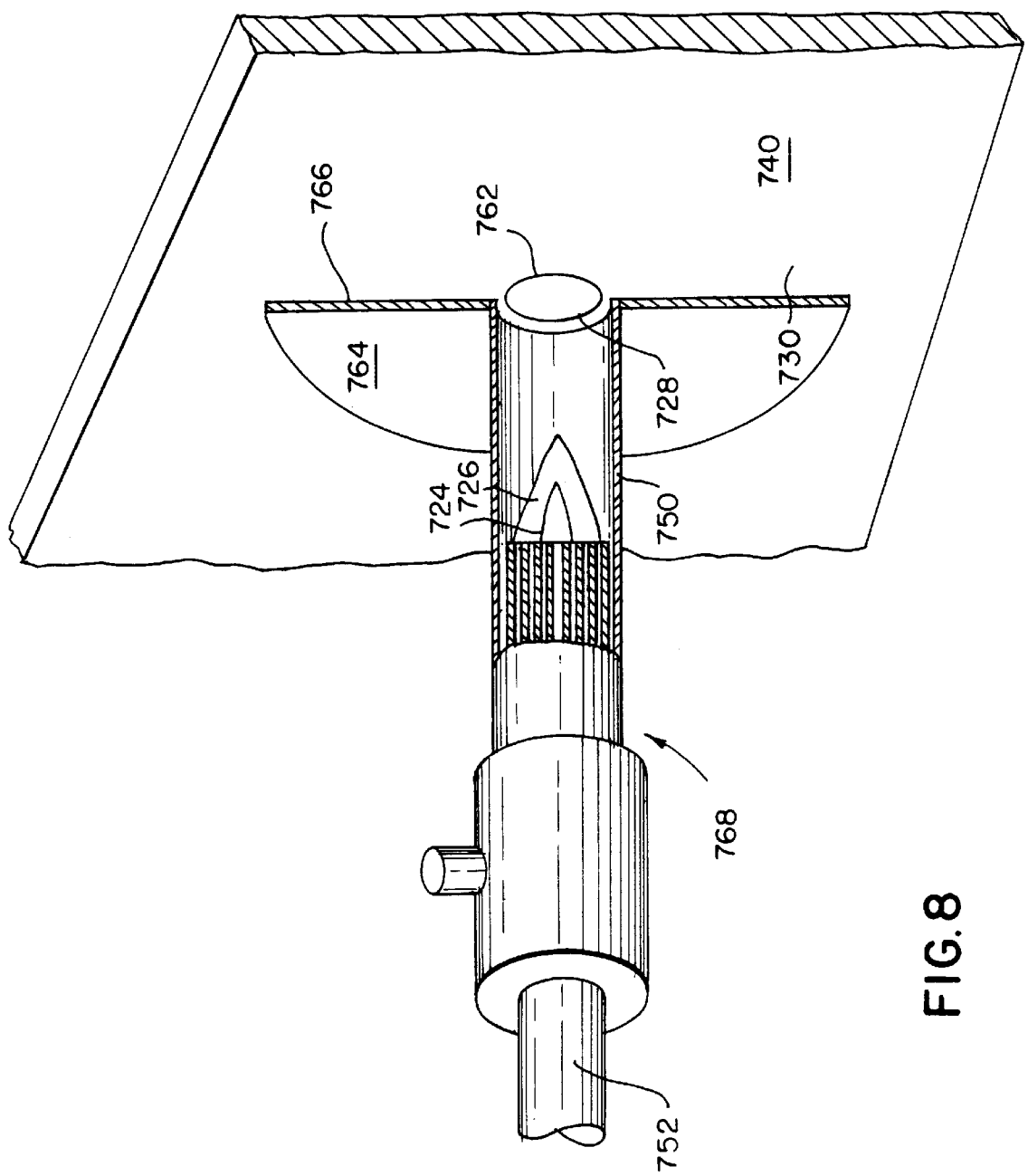
FIG. 8 is a close-up perspective view, partially in section, of a portion of the coating head used in the apparatus of FIG. 7.

The embodiment illustrated in FIGS. 7 and 8 is also particularly suitable for the production of coatings which are oxidation sensitive, such as most metal coatings. To provide such coatings the fuel is fed through conduit 744 in proximity to the atomized liquid media and coating precursor, while the oxidizer is fed through conduit 752. The atomizing gas fed through conduit 738 and/or the liquid media fed through conduit 722 can be materials having fuel value, they can be materials which react with the coating precursor or they can be inert materials. When the produced coatings or coating precursor materials are oxygen sensitive, a reducing atmosphere is maintained in the reaction and deposition zones by assuring that the total amount of oxidizer fed is restricted to an amount less than that required to fully combust the fuel provided to the reaction zone, i.e. the oxidizer is provided in less than stoichiometric amount. Generally, the fuel excess is limited so as to limit any flame zone which develops when the residual hot gases mix with atmospheric oxygen. When the produced coatings and the precursor materials are oxygen-tolerant or enhanced by the presence of oxygen, such as in the production of most of the oxide coatings, an oxidizing or neutral atmosphere may be provided in the reaction and deposition zones by feeding a stoichiometric or excess amount of oxidizer. Further, with oxygen tolerant reagents and products, the oxidizer can be fed through the inner conduit 744 while fuel is fed through outer conduit 752.

The inert gas supplied through conduit 760 must be sufficient to shield the inside surface of the conduit from the reactive gases produced in the reaction zone, and it must be sufficient, when added with the other gases from the reaction zone, to provide the gas velocity required in the barrier zone.

The energy input can be accomplished by mechanisms other than the combustion method I illustrated in FIGS. 7 and 8. For instance, it could be accomplished by passing electrical current through conduit 722 to create electrical resistance heat in the conduit which then transfers to the liquid medium and coating precursor as it passes through the conduit. It should be apparent that all of the conduits 722, 738, 744, 752 and 760 are not required when the energy input is accomplished by other than the combustion method. Usually one or both of conduits 744 and 752 are omitted when the energy input is provided by one of the electrically derived energy input mechanisms.

The porosity or density of the deposited coating can be modified by varying the distance between the flame zone and the deposition zone at the substrate's surface. Generally, shortening of this distance provides an increased coating density, while increasing the distance provides a more porous coating.

In the illustrated CACCVD technique the reaction zone is generally coextensive with the flame produced by the burning fuel. Of course, the flame zone and the substrate must be maintained sufficiently far apart that the substrate is not damaged by the higher temperatures which would result as the flame zone more closely approaches the substrate surface. While substrate temperature sensitivity varies from one substrate material to the next, the temperature in the deposition zone at the substrate surface, typically, is at least 600° C. cooler than the maximum flame temperature.

When some of the alternate methods are used to supply the energy input, such as when the principal energy input is a preheated fluid which is mixed with the flowing stream in, or before it reaches, the reaction zone, the maximum temperatures produced in the reaction zone are substantially lower than those produced with a combustion energy input. In such cases the coating properties can be adjusted by varying the distance between the reaction zone and at the substrate surface with less concern for overheating the substrate. Accordingly, the terms reaction zone and deposition zone are useful in defining functional regions of the apparatus but are not intended to define mutually exclusive regions, i.e. in some applications reaction of the coating precursor may occur in the deposition zone at the substrate surface.

The lower maximum temperatures resulting when the principal energy input is other than a combustion flame enables the use of temperature sensitive coating materials, such as some organic materials. In particular, polymers may be deposited as protective coatings or as dielectric interlayer materials in capacitors, integrated circuits or microprocessors. For instance, a polyamide coating could be provided from its polygamic acid precursor. Similarly, polytetrafloroethylene coatings could be provided from low molecular weight precursors.

The energy input to the flowing stream prior to its leaving the reaction zone generally negates the need to provide energy to the deposition zone by heating the substrate, as is often required in other coating techniques. In the present deposition system, since the substrate acts as a heat sink to cool the gases present in the deposition zone, rather than heating them, the temperatures to which the substrates are subjected are substantially less than are encountered in systems which require that energy be transmitted to the deposition zone through the substrate. Accordingly, the CACCVD coating process can be applied to many temperature sensitive substrate materials which can not be coated by techniques which involve heating through the substrate.

A wide range of precursors can be used as gas, vapor or solutions. It is preferred to use the lowest cost precursor which yields the desired morphology. Suitable chemical precursors, not meant to be limiting, for depositing various metals or metalloids are as follows:

Pt platinum-acetylacetonate [Pt(CH$_3$COCHCOCH$_3$)$_2$] (in toluene/methanol), platinum-(HFAC$_2$), diphenyl-(1,5-cyclooctadiene) Platinum (II) [Pt(COD) in toluene-propane]platinum nitrate (in aqueous ammonium hydroxide solution)

Mg Magnesium naphthenate, magnesium 2-ethylhexanoate [Ma(OOCCH(C$_2$H$_5$)C$_4$H$_9$)$_2$], magnesium naphthenate, Mg-TMHD, Mg-acac, Mg-nitrate, Mg-2,4-pentadionate Si tetraethoxysilane [Si(OC$_2$H$_5$)$_4$], tetramethylsilane, disilicic acid, metasilicic acid P triethyl phosphate [C$_2$H$_5$O)$_3$PO$_4$], triethyllphosphite, triphenyl phosphite La lanthanum 2-ethylhexanoate [La(OOCCH(C$_2$H$_5$)C$_4$H$_9$)$_3$] lanthanum nitrate [La(NO$_3$)$_3$], La-acac, La-isopropoxide, tris (2,2,6,6-tetramethyl-3,5-heptanedionato), lanthanum [La(C$_{11}$H$_{19}$O$_2$)$_3$]

Cr chromium nitrate [Cr(NO$_3$)$_3$], chromium 2-ethylhexanoate [Cr(OOCCH(C$_2$H$_5$)C$_4$H$_9$)$_3$], Cr-sulfate, chromium carbonyl, chromium(III) acetylacetonate Ni nickel nitrate [Ni(NO$_3$)$_2$] (in aqueous ammonium hydroxide), Ni-acetylacetonate, Ni-2-ethylhexanoate, Ni-napthenol, Ni-dicarbonyl Al aluminum nitrate [Al(NO$_3$)$_3$], aluminum acetylacetonate [Al(CH$_3$COCHCOCH$_3$)$_3$], triethyl aluminum, Al-s-butoxide, Al-i-propoxide, Al-2-ethylhexanoate Pb Lead 2-ethylhexanoate [Pb(OOCCH(C$_2$H$_5$)C$_4$H$_9$)$_2$], lead naphthenate, Pb-TMHD, Pb-nitrate Zr zirconium 2-ethylhexanoate [Zr(OOCCH(C2H$_5$)C$_4$H$_9$)$_4$], zirconium n-butoxide, zirconium (HFAC$_2$), Zr-acetylacetonate, Zr-n-propanol, Zr-nitrate Ba barium 2-ethylhexanoate [Ba(OOCCH(C$_2$H$_5$)C$_4$H$_9$)$_2$], Ba-nitrate, Ba-acetylacetonate, Ba-TMHD Nb niobium ethoxide, tetrakis(2,2,6,6-tetramethyl-3,5-heptanedionato) niobium Ti titanium (IV) i-propoxide [Ti(OCH(CH$_3$)$_2$)$_4$], titanium (IV) acetylacetonate, titanium-di-i-propoxide-bis-acetylacetonate, Ti-n-butoxide, Ti-2-ethylhexanoate, Ti-oxide bis(acetylacetonate)

Y yttrium 2-ethylhexanoate [Y(OOCCH(C$_2$H$_5$)C$_4$H$_9$)$_3$], Y-nitrate, Y-i-propoxide, Y-napthenoate Sr strontium nitrate [Sr(NO$_3$)$_2$], strontium 2-ethylhexanoate, Sr(TMHD)

Co cobalt naphthenate, Co-carbonyl, Co-nitrate,

Au chlorotriethylphosphine gold (I), chlorotriphenylphosphine gold(I)

B trimethylborate, B-trinethoxyboroxine

K potassium ethoxide, potassium t-butoxide, potassium 2,2,6,6-tetramethylheptane-3,5-dionate Na sodium 2,2,6,6-tetramethylheptane-3,5-dionate, sodium ethoxide, sodium t-butoxide Li lithium 2,2,6,6-tetramethylheptane-3,5-dionate, lithium ethoxide lithium-t-butoxide Cu Cu(2-ethylhexonate)$_2$, Cu-nitrate, Cu-acetylacetonate Pd paladium nitrate (in aqueous ammonium hydroxide solution) (NH$_4$)$_2$Pd(NO$_2$)$_2$, Pd-acetylacetonate, ammonium hexochloropalladium Ir H$_2$IrCl$_6$ (in 50% ethanol in water solution), Ir-acetylacetonate, Ir-carbonyl Ag silver nitrate (in water), silver nitrate, silver fluoroacetic acid, silver acetate Ag-cyclohexanebutyrate, Ag-2-ethylhexanoate Cd cadmium nitrate (in water), Cd-2-ethylhexanoate Nb niobium (2-ethylhexanoate)

Mo (NH$_4$)$_6$Mo$_7$O$_{24}$, Mo(CO)$_6$, Mo-dioxide bis (acetylacetonate)

Fe Fe(NO$_3$)$_3$9H$_2$O, Fe-acetylacetonate

Sn SnCl$_2$2H$_2$O, Sn-2-ethylhexanoate, Sn-tetra-n-butyltin, Sn-tetramethyl

In In(NO$_3$)$_3$xH$_2$O, In-acetylacetonate

Bi Bismuth nitrate, Bismuth 2-ethyl hexonate

Ru Ru-acetylacetonate

Zn Zn-2-ethyl hexonate, Zn nitrate, Zn acetate

W W-hexacarbonyl, W-hexafluoride, tungstic acid

In most cases where a mixture of metal precursors and/or metalloid precursors are deposited, the deposition is generally stoichiometric with respect to the relative proportions of the metal(s) and/or metalloid(s) provided by the precursors in the reaction mixtures. However, this relationship is neither precise nor entirely predictable. Nevertheless, this does not present any significant problem in achieving a coating layer or powder of desired composition because the relative amounts of chemical precursors required to obtain a coating layer or powder of desired composition can be readily determined without undue experimentation for any set of coating parameters. Once a ratio of chemical precursors under a set of coating parameters is determined to obtain a coating or powder of desired composition, the coating can be duplicated with highly predictable results. Thus, if one desired a coating or powder that would contain two metals in a particular predetermined ratio, one might start out with two chemical precursors containing the two metals in the predetermined stoichiometric ratio. If determined that the two metals were not deposited in the predetermined ratio, adjustments would be made in the relative amounts of the two precursor chemicals until the desired ratio of metals in the deposited materials was achieved. This empirical determination would then be relied upon for future depositions.

CCVD has the advantages of being able to deposit very thin, uniform layers which may serve as the dielectric layers of embedded capacitors and resistors. For embedded capacitors, the deposited dielectric layers are typically between about 0.03 and about 2 microns thick, preferably between about 0.1 and about 1 micron thick and most preferably between about 0.2 and about 0.6 microns thick. The material can be deposited to any desired thickness; however, for forming layers by CCVD or CACCVD, thicknesses seldom exceed 5 microns. Because the thinner the dielectric layer, the higher the capacitance, the ability to deposit very thin films is an advantageous feature of the CCVD process. The thinness of the metallic coating which may be deposited as part of the capacitor structure also facilitates rapid etching.

Examples of coatings produced by CCVD include silicon dioxide coatings produced from a solution of tetraethoxysilane [Si(OC$_2$H$_5$)$_4$] in isopropanol and propane; platinum coatings produced from a solution of platinum-acetylacetonate [Pt(CH$_3$COCHCOCH$_3$)$_2$] in toluene and methanol; and nickel-doped LaCrO$_3$ coatings produced from solutions of lanthanum nitrate in ethanol, chromium nitrate in ethanol and nickel nitrate in ethanol.

This invention is directed to thin film capacitor structures, and certain such structures will now be described in reference to FIGS. 4–6, although it is to be understood that these structures are not to be considered encompassing of possible thin layer capacitor structures to which the present invention is directed. The thin film capacitor structures described herein for embedding in printed circuitry, and the unsupported capacitor structures must have some flexibility. This distinguishes capacitor structures produced for the semiconductor industry on silicon wafers which are rigid structures. Herein, "flexible" when used in respect to capacitor structures and parts of capacitor structures, e.g., metal foils, dielectric layers, etc., means capable of being bent around a 6-inch radius without damage or destruction.

Figure 4A:
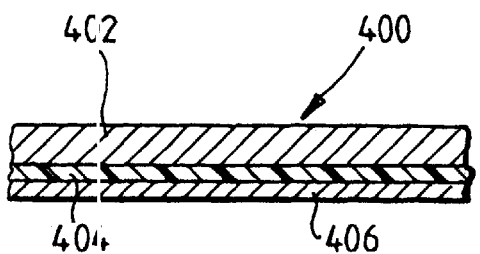
FIGS. 4A, 4B and 4C are cross-sectional views of capacitors comprising or formed from a three-layer structure of a metal foil, a dielectric layer, and a deposited metal layer.

FIG. 4A is directed to a three-layer structure 400. On a flexible metal foil 402 is deposited, e.g., by CCVD or CACCVD, a dielectric material layer 402, and on the dielectric material layer 404 is deposited a metal layer 406. The metal layer 406 may be deposited entirely by CCVD or CACCVD, or a very thin (0.005 to 0.1 micron) seed layer of metal (e.g., platinum) deposited and additional metal, (e.g., Cu, Ni or Zn) deposited by electroplating to a desired thickness. Generally, a sufficient seed layer is deposited when the electrical resistance between two surface contact points is 1 megohm or less. The metal foil 402 is typically between about 12 and about 110 microns thick. The deposited metal layer 406 is electrically functional at about 0.1 microns, although for structural integrity this layer will typically be 0.5 to 3 microns thick, or even thicker if desired. The structure of FIG. 4A is, in itself, a capacitor, and may be used as such in a printed circuit board as a decoupling capacitor to help maintain square electrical signals.

Figure 4B:
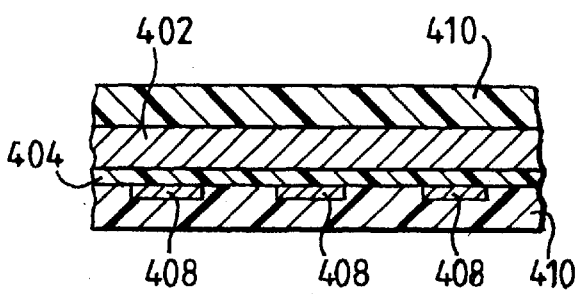
Figure 4C:
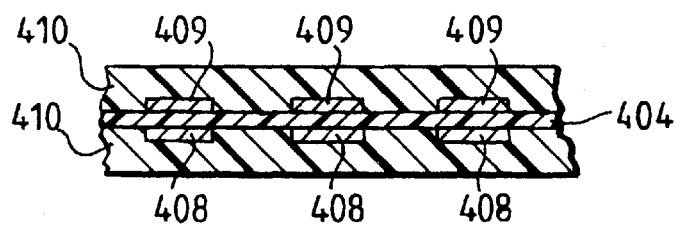

In FIG. 4B, the deposited metal layer 406 of FIG. 4A has been patterned by photoresist imaging and etching to produce discrete patches 408 of metal. In this structure, the foil 402 serves as a common electrical conductive capacitor plate, the dielectric layer 404 serving as a common dielectric layer, and multiple discrete capacitor plates are provided by the discrete patches of metal opposed to the common plate. In cases where it is undesirable that a common plate serve for all opposed discrete capacitor plates, the foil 402 can be similarly patterned into discrete capacitor plates by a photoresist/etching process. If so, after the deposited metal layer 406 is patterned into discrete plates 408, this side of the structure is laminated to the epoxy resin layer 410 prior to photoresist/etching processing of the foil layer, whereby the laminated resin 410 provides support for the structure after the foil 402 is patterned. Then, the foil side is also laminated with another epoxy resin layer 410 to produce an embedded structure. A structure in which the Foil layer is patterned into discrete plates 409 is shown in FIG. 4C.

In embedded layers, the plates are conventionally connected to electronic circuitry by plated via holes (not shown).

Figure 5A:
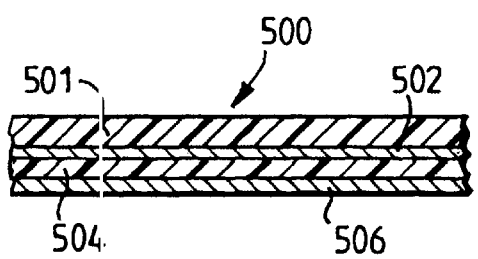
FIGS. 5A and 5B are cross-sectional views of a four layer capacitor structures of a polymeric film, a first deposited metal layer, a dielectric material layer, and a second deposited metal layer.
Figure 5B:
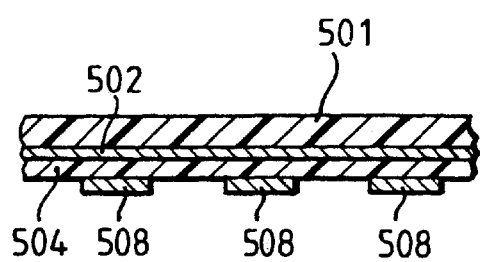

FIG. 5A is a capacitor structure 500 in which successive deposition of layers is on a polymeric support sheet 501. A metal layer 502, e.g., nickel or copper, is deposited by CACCVD on a polyamide sheet; a dielectric layer 504 is deposited thereon; and a second metal layer 506 is then deposited by CCVD, CACCVD or by electroplating. The structure 500 is a capacitor and may serve in this form as a decoupling capacitor in the manner of the structure 400 of FIG. 4A. The final metal layer 506 can be patterned to produce the discrete capacitor plates 508 of FIG. 5B in a photoresist/etching process. The capacitor structure 500, either as shown in FIG. 5A as a decoupling capacitor or with a patterned metal layer providing discrete capacitor plates 508 on one side of the structure, is generally embedded in epoxy resin. A second capacitor structure could also be formed on the other side of the polymeric support sheet 501 by successively depositing a metal layer, a dielectric layer and another metal layer. In such a structure, the metal layers 502, 506 are each between about 0.5 and about 3 microns thick and the dielectric layer 504 between the metal layers is between about 0.03 and about 2 microns thick.

Figure 6:
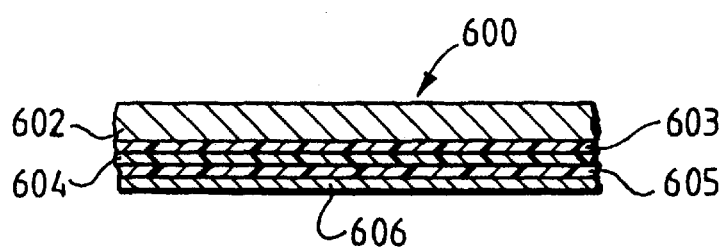
FIG. 6 is a cross-sectional view of a 5-layer structure including a metal foil, a barrier layer, a dielectric layer, an adhesion layer and a deposited metal layer.

In FIG. 6, a five-layer structure 600 is formed including a flexible foil 602, a barrier layer 603 that serves as a heat barrier to prevent the foil layer from melting or from oxidation and/or a diffusion barrier to prevent chemical interaction between the foil layer and the dielectric material layer, a dielectric layer 604, an adhesion layer 605, and a deposited metal layer 606. The functions and compositions of the barrier layer 603 and of the adhesion layer 605 are to be discussed in greater detail hereinafter.

An important class of dielectric material layers which may be deposited by CCVD in accordance with the invention are silica and silica-based compositions, including 100% silica layers, amorphous and crystalline, but also doped silica and silica mixed with other oxides, such as PbO, $Na_2O$, $Li_2O$, $K_2O$, $Al_2O_3$, and $B_2O_3$. Herein, silica-based compositions are defined as dielectric materials having from about 1%, preferably at least about 3 wt %, more preferably at least about 20 wt % up to 100 wt % silica Generally, silica comprises at least about 10 mole percent, preferably at least 40 mole percent up to 100 mole percent of a silica-based composition. The reason why compositions may be considered "silica-based composition" having very low weight percentages of silica is that many of the oxides, such as lead oxide, with which the silica may be co-deposited have high molecular weights compared to silica.

Some silica-based compositions deposited as dielectric materials are set forth in the following table.

| Dielectric Compositions | Component | Composition of Fraction (wt %) | | | | | | | |
|---|---|---|---|---|---|---|---|---|---|
| Amorphous Silica $SiO_2$ | $SiO_2$ | 100 | | | | | | | |
| Lead Silicate (with lithium, sodium, potassium, aluminum, and boron) | $SiO_2$ | 41 | 27.4 | 51.1 | 3 | 5 | 63 | 56 | 42 |
| | PbO | 52.3 | 62.8 | 48.9 | 75 | 82 | 22 | 29 | 49 |
| | $Na_2O$ | 5.2 | 2.1 | — | — | — | 7 | 4 | 2 |
| | $Li_2O$ | 1.3 | 0.7 | — | — | — | — | — | 1 |
| | $K_2O$ | 14.1 | 7.0 | — | — | — | 7 | 9 | 6 |
| | $Al_2O_3$ | — | — | — | 11 | 3 | 1 | 2 | — |
| | $B_2O_3$ | — | — | — | 11 | 10 | — | — | — |
| Doped silica | $SiO_2$ Dopants (Pt, B, Ba, Ca, Mg, Zn etc.) | Dopant amounts vary according the degree of doping | | | | | | | |

The dielectric layer may have layers of different composition. For example, a multi-layer film can be of alternating layers of silica and lead silicate, a dual layer comprising a lead silicate base with a top coat of lead aluminum boron silicate, or a compositely gradient film of silica to doped silica to lead silica. The multi layers may be deposited by varying the content of the precursor solution which is fed to the flame or by moving the substrate to successive deposition stations where layers of different composition are deposited.

Dielectric materials in accordance with the invention may be doped with a variety of elements, such as Pt, B, Ba, Ca, Mg, Zn, Li, Na, K, etc. The dopants will affect the dielectric value of the dielectric layer. Generally a material is considered a dopant if it is present at up to about 25 wt % of the dielectric, e.g., silica-based glass, typically no more than about 5 wt %.

Some other dielectric materials which may be deposited by CCVD include, but are not limited to BST, $SrTiO_3$, $Ta_2O_5$, $TiO_2$, $MnO_2$, $Y_2O_3$, $SnO_2$, and PLZT.

A material particularly suitable as a dielectric material for thin film capacitors is barium titanium oxide ($Ba_2Ti_9O_{20}$) and zirconium-doped barium titanium oxide ($Ba_2Ti_{1-(9-x)}Zr_{x-8}O_{20}$); x>0). To function as dielectric layers, these materials preferably are deposited in crystalline form. Barium titanium oxide has been used as a microwave ceramic material in bulk form for wireless communication. It is believed that use of these materials as a dielectric for thin film capacitors is unique. Zirconium-doped barium titanium oxide can provide a high quality factor, e.g., 14000 at 3 Ghz, and a dielectric constant of about 40. Also, zirconium has a wide range of temperature coefficient of resonance frequency (0–9 ppm/° C.) in telecommunication applications. These materials are low loss, reducing consumption of electrical energy and generation of thermal energy. These materials have high permittivity, thereby permitting capacitors of small size to provide high capacitance. Accordingly, barium titanium oxide, particularly zirconium doped capacitors are ideal candidates for demanding electronics, especially in high frequency applications where loss is always in need of reductions.

Tin-doped barium titanium oxide ($Ba_2Ti_{1-(9-x)}Sn_{x-8}O_{20}$; x>0) can also be used, but is less preferred relative to the zirconium-doped counterpart.

All of these materials can be deposited a thin layers on a substrate by the CCVD process by appropriate selection of precursors in the precursor solution.

The dielectric layer acts to prevent the flow of electrons between the capacitor plates, whereby a charge may be built up on between the plates. However, is some cases, a certain amount of leakage is desired between the plates, particularly in decoupling capacitors, such as may be formed with the structure of FIG. 4A. Glasses, including, but not limited to silica glass and lead silica glass, may be doped with single valent cations, such as $Na^+$, $K^+$, $Li^+$, $Ag^+$, etc. functioning as ionic conductors. The amount of doping required to achieve the desired degree of lossy-ness will vary upon a variety of factors, including the particular dielectric used, the thickness etc. Also a thinner layer can be deposited to increase capacitance and loss. These layer should be from 0.05 to 0.3 $\mu m$ thick. Generally lossy dielectrics will have an electrical conductivity value of from about $10^{-1}$ to about $10^{-5}$ amperes per $cm^2$.

If metal foil is the substrate upon which the dielectric layer is deposited, e.g., as discussed above in reference to FIG. 4A, the most common choice is copper foil. Most electronic circuitry utilizes copper as the primary conductive element.

However, in accordance with the invention, alternative conductive metals, particularly metal foils, as substrates for dielectric layer deposition are herein suggested. Copper melts at 1083° C.; thus, deposition on copper is limited to materials which can be deposited by CCVD at lower temperatures. Accordingly, materials which must be deposited at temperatures upwards of about 1000° C. cannot be deposited on copper, but must be deposited on a substrate which melts at a higher temperature.

Proposed metal substrates for higher temperature CCVD applications have melting points upward of about 1350° C. so as to withstand higher deposition temperatures required for certain materials to be deposited by CCVD. Barium strontium titanate (BST) is an example of a dielectric material which cannot be deposited on copper and crystallize to the desired material. To obtain the desired crystalline structure, BST must be deposited at higher temperatures, such as the deposition temperatures which the substrates of the present invention can be deposited. Examples of other materials which are not suitable for deposition on copper by CCVD, but which may be deposited on the substrates of the present invention, include, but are not limited to oxide and mixed oxide phases which contain Ti, Ta, Nb, Zr, W, Mo or Sn. Furthermore, copper has a relatively high coefficient of linear thermal expansion, typically considerably higher than many of the proposed dielectric material layers, particularly oxides, that would be deposited thereon. If there is a substantial mismatch in coefficients of thermal expansion between the substrate and the CCVD-deposited film, the film that was deposited at high temperature may crack as the coated substrate film cools. Preferably, metal substrates for CCVD deposition have coefficients of linear thermal expansion below about 15 ppm° $C^{-1}$, more preferably below about 12 ppm° $C^{-1}$. To avoid thermal cracking of the film, the coefficient of linear thermal expansion of the substrate should be no more than about 80% above that of the material to be deposited, preferably no more than about 40% above that of the material to be deposited and most preferably no more than about 20% above that of the material to be deposited. The closer the coefficient of thermal expansion, the thicker the material the coating material can be deposited and/or the higher the deposition temperature may be without cracking of the coating.

Specific metals and alloys e.g., as foils, which serve as high-temperature or low thermal expansion substrates in accordance with the invention include nickel, tungsten, iron, niobium, molybdenum, titanium, nickel/chromium alloy, and iron/nickel/chromium alloy, such as that sold under the trademark Inconel®. In the nickel/chromium and iron nickel chromium alloys, iron is present at between 0 and about 25 wt %, nickel between about 50 and about 80 wt %, and chromium between about 10 and about 30 wt %. If iron is present, it is typically present at least 2 wt %.

These metals have low thermal expansion, which will be needed with proposed future PWB dielectric polymer materials such as liquid crystals, and also have low thermal conductivity. A low thermal expansion printed wiring board (PWB) will have easier interconnection with silicon based direct attached chips (less strain during thermal changes). These materials are important because they are a close match to liquid crystal polymers' thermal expansion, low or moderate in price, are etchable, solderable, and have good or reasonable thermal and electrical conductivities. Except for iron all form more protective oxides than Cu. Another thermal expansion consideration is the coating material, which may be applied to form materials for such applications as resistor, capacitors and inductors. All of these materials are closer in thermal expansion to oxides for dielectric applications, and can withstand higher temperature than copper, which is currently used for embedded devices, hence enabling the depositions of higher temperature dielectric or ferroelectric materials such as barium strontium titanate and lead lanthanum zirconium titanate.

Copper has a melting point of 1083 ° C. The higher melting point of these metals enable the depositions of various materials not depositable on copper and the lower thermal expansion prevents the film cracking due to the thermal expansion mismatch. Furthermore, the oxides formed on these metal surfaces are less oxygen permeable than copper oxide and hence impede further oxidation to the bulk metals. Some selected physical properties are listed in the following table for this invention-suggested metals along with the comparison with copper.

|  | W | Mo | Nb | Ingot Iron | Liquid crystal | Ni | Copper |
| --- | --- | --- | --- | --- | --- | --- | --- |
| Thermal expansion, $10^6/°$ C. | 4.5 | 4.8 | 7.3 | 11.7 | 5 | 13.3 | 16.5 |
| Electrical resistively, $\mu\Omega cm$ | 5.6 | 43 | 15.2 | 9.7 | dielectric | 10 | 1.7 |
| Thermal Conductivity, W/cm ° C. | 1.74 | 1.38 | 0.537 | 0.82 | Approx. 0 | 0.907 | 4.01 |
| Melting point ° C. | 3422 | 2623 | 2477 | 1540 | Approx. 0 | 1440 | 1080 |

If copper foil, or another metal foil with similar low melting temperature and/or oxide-forming tendencies, is the foil substrate of choice, FIG. 6 discussed above illustrates a five-layer structure comprising a metal foil layer 602, a barrier layer 603, a dielectric layer 604, an adhesion-promoting layer 605 and a deposited metal layer 606. The barrier layer 603 is a CCVD-deposited layer of a material, e.g., Tungsten oxide ($WO_3$), Strontium oxide (Sr), mixed tungsten strontium oxides, such as $SrWO_4$, $BaWO_4$, $SiO_2$, $Cr_2O_3$, $Al_2O_3$, Ni, Pt and very thin multilayers of these, which can be deposited at a sufficiently low temperature that neither melting nor oxidation of the metal foil layer is a problem. Subsequently, a dielectric layer 604 may be deposited at a higher temperature than would be acceptable on the bare surface of the foil 602. The barrier layer 603 is generally thin, i.e., between about 0.01 and about 0.08 micron thick.

In some cases, adhesion problems have been experienced between (with reference to FIG. 6) the dielectric material of layer 604 and the deposited metal layer 606. For example, adhesion problems have been exhibited between a deposited silica layer and a deposited platinum layer. In such case, an adhesion (or interfacial) layer 605 may be deposited. For example, a layer 605 of chromia has been found to promote adhesion between platinum and silica. The adhesion layer may be a conductive oxide, such as zinc oxide. The adhesion layer 605 may also be a functionally gradient material (FGM) layer in which the composition of the layer changes throughout the layer. For example, silica-to-platinum adhesion may be promoted by a silica/platinum adhesion layer 605 which changes incrementally or continuously in composition from high silica content at the silica side to high platinum content at the platinum side. Deposition of functionally gradient material layers is possible using CCVD by either continuously changing the content of the precursor solution during deposition or depositing the layer at several stations along a coating line. In general, a material, which contains elements in common with the two layers between which it is interposed, acts to promote adhesion. The adhesion layer 605 is likewise typically quite thin, i.e., between about 0.001 and about 0.05 micron thick.

If a conductive oxide is used as the adhesion layer 605, it is possible to use such layer as a seed layer for electroplating, e.g., of copper, nickel or zinc. Zinc oxide, for example can be used as a seed layer for electroplating of zinc, whereby excellent adhesion is realized by an oxide dielectric layer and the plated zinc layer.

While FIG. 6 shows a structure with both a barrier layer 603 between the foil 602 and the dielectric layer 604 and an adhesion layer 605 between the dielectric layer 604 and the deposited metal layer 606, it is to be understood that a capacitor structure may contain only a barrier layer 603 or only an adhesion layer 605 as is necessitated by construction constraints.

Alternatively it may be necessary to provide adhesion and barrier layer on both side of the dielectric.

Among other factors, capacitance of a capacitor in accordance with this invention is a function of the surface area of the dielectric material. Accordingly, increasing the surface area at the interface of the dielectric material layer and the metal, e.g. metal foil, on which it is deposited and increasing the surface area at the interface of the dielectric layer and a metal layer deposited thereon while maintaining intimate contact, increases capacitance. If a metal foil is the substrate, as per FIG. 4A, it is generally possible to obtain such foils with varying degrees of surface roughness. Surfaces of foil may be further roughened mechanically, electrically, or chemically. Thus, for example, one might purchase a foil with a known degree of micro-roughness, and chemically etch to add nano-roughness. For meaningfully increasing capacitance, it is desired that the roughness of a metal on which a dielectric layer is to be deposited be at least 1.1, preferably at least about 2 $cm^2/cm^2$. Preferably the roughness is less that 5 $cm^2/cm^2$, due to degradation of dielectrics electrical properties. Another parameter of surface roughness is feature height, which is preferably less that about 5 microns, more preferably less than about 2 micrometers. In some cases it is desired to have features of these less than 0.5 micrometers.

Because of the thinness of the dielectric layer that is deposited, it is more difficult to roughen the surface, although some chemical roughening may be done chemically. Roughness also improves adhesives in PWB. If to rough, then the dielectric can not be made continuous and some capacitors are shorted. Surface roughening of the dielectric material layer may best be achieved by adjusting its deposition conditions so as to deposit a layer with a rough exposed surface. Various factors, such as deposition temperature, may affect the roughness of the dielectric material layer surface; however, the most significant factor affecting surface roughness of the dielectric material layer appears to be deposition rate. As a rule of thumb, if one were to obtain a set of deposition parameters for optimal smoothness at highest deposition rate, and then double or triple that deposition rate, one would obtain a rough surface. Preferably the surface of the deposited dielectric material is at least about 1.2 $cm^2/cm^2$, preferably at least 2.6 $cm^2/cm^2$. Preferably the roughness is less that 20 $cm^2/cm^2$, due to degradation of dielectrics electrical properties. Preferably the feature height of the dielectric relative to the substrate surface is less than 2 microns, preferably at least about 1 micron. The surface area should be increased at least 10% and preferably at least 30%, in some cases it is desired to be increased at least 60%, compared to the substrate prior to any dielectric deposition.

One of the most important metals which can be deposited as a metal layer, such as layer 406 in FIG. 4A, in doped or undoped form by CACCVD, is nickel. Nickel is inexpensive and can be selectively etched relative to other conductive metals, such as copper. An important precursor for depositing zero valence nickel by CACCVD is nickel nitrate. Nickel may be deposited from an ammoniacal aqueous solution of nickel nitrate. However, as described above, it is preferred that deposition be from a liquid at conditions approaching supercritical. To this end, advantageous carriers for nickel nitrate include liquefied ammonia or liquefied nitrous oxide ($N_2O$). Nitrous oxide may be liquefied by pressurizing to 700–800 psi. Ammonia may be liquefied by pressurization and/or low temperatures. Whether the carrier is liquefied ammonia or liquefied nitrous oxide, it is found advantageous to add a minor portion of water, i.e., up to about 40 wt %, preferably between about 2 to about 20 wt %, (the liquefied ammonia or liquefied nitrous oxide comprising the balance, between about 60 and about 100 wt %). The water raises the supercritical point of either liquefied ammonia or liquefied nitrous oxide. This makes it easier to operate sufficiently below the supercritical point such that variations in viscosity and density are not encountered. Also, the addition of water reduces the instability of the solutions. (It is to be understood, however, that depositions may, in some cases, be carried out in liquified ammonia or liquefied nitrous oxide without the addition of water.) In such, nickel deposition solutions, the nickel precursor along with any precursor for a nickel dopant are typically present at a low level, i.e., from about 0.001 wt % to about 2.5 wt %. Currently preferred dopants for nickel are nickel phosphorous and/or nickel phosphorous oxides, e.g., nickel phosphate. It is believed that when using a phosphorus-containing precursor, such as phosphoric acid, the major dopant species is nickel phosphate. Precursor solutions in which water and either liquefied ammonia or $N_2O$ are the carrier co-solvents are advantageous in that no carbon is present which could result in deposition of carbon.

When preparing a precursor solution of nickel nitrate to be carried in liquefied ammonia, the nickel nitrate may be conveniently pre-dissolved in ammonium hydroxide solution along with precursor for any dopant, and this solution then admixed with liquefied ammonia.

As noted above, there may be instances where it is desirable to etch a silica or silica-based dielectric layer. Suitable etchants for silica and silica-based compositions include ammonium hydrogen difluoride, fluoroboric acid and mixtures thereof. One particularly suitable etchant for silica and silica-based compositions is an aqueous solution of 1.7 wt % ammonium hydrogen difluoride, and 1.05 wt % fluoroboric acid. Other materials can be added to a mixture of these two components.

The invention will now be described in greater detail by way of specific examples.

EXAMPLE 1

One sample was prepared to evaluate the electrical properties of the silica film using I-V and C-V measurements. The film consisted of amorphous silica (100% SiO2) with a thickness of 0.25 mm and was deposited on Si/Ti/Pt wafer. The deposition was accomplished by using combustion chemical vapor deposition (CCVD). The precursor solution consisted of 0.873 wt % tetraethyloxysilane, 7.76 wt % isopropyl alcohol and 91.4 wt % propane. The solution was then nebulized by near supercritical atomizer into a flame. The flame was directed at the wafer and the deposition was completed in 10 minutes.

To provide a top electrodes, aluminum dots of 500 nm thickness were deposited by masking e-beam technique. The aluminum dots were of two diameters; 1.5 mm and 0.7 mm. The individual dot then act as a capacitor. The capacitors were characterized by HP4280A 1 MHz C meter for C-V measurement and HP4010A I-V pA meter for IV. Generally, the leakage current density of 1–3 $nA/cm^2$ was measured at the electric field of 0.5 MV/cm. The average breakdown voltage measured for the capacitors (dots) of 1.5 mm diameter was 74.3 V, and every capacitor showed breakdown. For capacitors of 0.7 mm diameter, five out of the eleven capacitors sustained up to 100 V bias and the average breakdown voltage was 80V. The average breakdown filed strength of films were 2.9 to 3.2 MV/cm. These capacitor area dependence showed that the breakdown values depend on not only the intrinsic properties of the dielectric films but also the number of flaws in the films. When a breakdown voltage of above 100V bias was measured, this indicated that the breakdown field strength of the silica film was over 4 MV/cm.

The capacitance density (nF/cm2) of the silica dielectric films were 20.01–20.69 $nF/cm^2$. The electrical measurement is summarized in the following table.

| | | |
|---|---|---|
| Capacitor Size, ×10⁻³ cm² | 17.67 | 4.42 |
| Capacitance Density, nF/cm² | 20.01 | 20.69 |
| Leakage Current Density, nA/cm² | 1.24 | 3.12 |
| Breakdown Voltage, V | 74.3 | 80.0 |
| Breakdown Field, MV/cm | 2.97 | 3.2 |

EXAMPLE 2

A silica film of 0.07 μm (at edge) to 0.14 μm (at center) thickness was deposited on Cu foil via CCVD processing. The film was deposited using the same precursor solution and by the same process as described in Example 1. The deposition was accomplished in 9 minutes.

The aluminum top electrodes of 0.50 μm thickness were applied by e-beam masking technique and the Cu foil substrate served as a ground electrode. The C-V measurement instrument was HP4280A 1MHz C meter and the I-V measurement was done by HP4010A I-V pA meter. Measurements were only performed at the area of 0.07 and 0.15 μm thickness and the results are summarized in the following table.

| | | Capacitance Density, nF/cm² | | | |
|---|---|---|---|---|---|
| Film Thickness | Number of Sample | Average | Standard Deviation | Maximum Value | Minimum Value |
| 1500A | 9 | 63.6 | 3.6 | 68.3 | 56.7 |
| 700A | 11 | 85.3 | 6.2 | 97.1 | 76.2 |

EXAMPLE 3

A silica film of unknown thickness (but was estimated from the deposition time to be half the thickness of the sample in Example 2) was deposited on Ni foil via CCVD processing. The film was deposited using the same precursor solution and by the same process as described in Example 1. The deposition time was 5 minutes.

The aluminum top electrodes of 0.5 μm thickness were applied by e-beam masking technique and the Ni foil substrate served as a ground electrode. The C-V measurement instrument was HP4280A 1MHz C meter and the I-V measurement was done by HP4010A I-V pA meter. The results are summarized in the following table.

|  | Number of Sample | Average | Standard Deviation | Maximum Value | Minimum Value |
|---|---|---|---|---|---|
| Capacitance Density, nF/cm2 | 15 | 67.83 | 8.94 | 89.5 | 56.5 |
| Breakdown Voltage | 15 | 5.6 | 3.3 | 12 | 2 |
| Dissipation Factor | 15 | 0.106 | 0.022 | 0.124 | 0.098 |

EXAMPLE 4

Barium strontium titanate (BST) was deposited on Ni-200 shim by the CCVD process. The precursor solution was composed of, by weight percentage, 0.79% barium bis(2-ethylhexanoate), 0.14% strontium bis(2-ethylhexanoate), 0.23% titanium diisopropoxide-bis(acetylacetonate) 17.4% toluene, and 81.5% propane. The film was deposited by the same process as described in Example 1. The deposition was completed in 48 minutes.

EXAMPLE 5

Silica solution for CCVD was consisted of 0.87 wt % tetraethyloxysilane, 7.76 wt % isopropyl alcohol, and 91.37 wt % propane. The mixing procedure for preparing Pt solution is as follows: platinum (II) acetylacetonate (0.33 wt %) and toluene (19.30 wt %) were ultrasonically mixed for 5 min before the addition of methanal (80.40 wt %). $SiO_2$-Pt were prepared in the following way: Ultrasonically mixed tetraethyloxysilane (0.38 wt %), isopropyl alcohol (2.02 wt %), platinum (II) acetylacetonate (0.30 wt %), and toluene (17.90 wt %) for 5 minutes and then added methanal (79.40 wt %). Thin films were deposited as the substrate moved across the flame of the combusted precursor solutions. Multilayers of silica, silica-platinum composite, and platinum were deposited in that order; the Pt-$SiO_2$ was coated to act as an interfacial layer for adhesion improvement which is currently being investigation.

EXAMPLE 6

Silica solution for CCVD was consisted of 0.87 wt % tetraethyloxysilane, 7.76 wt % isopropyl alcohol, and 91.37 wt % propane. Chromia solution was composed of 0.10 wt % chromium (III) acetylacetonate, 14.60 wt % toluene, 5.70 wt % 1-butanol, and 79.60 wt % propane. Pt solution was prepared in the following way: platinum (II) acetylacetonate (0.33 wt %) and toluene (19.30 wt %) were ultrasonically mixed for 5 min before the addition of methanol (80.37 wt %). Silica (base layer), Chromia (interfacial layer), and platinum (electrode) thin films were deposited as copper substrate (TC/TC) moved across the flame of the combusted precursor solutions. The specimen was then electroplated with copper and subject to peeling test.

EXAMPLE 7

Silica solutions for CCVD were consisted of (1) 0.87 wt % tetraethyloxysilane, 7.76 wt % isopropyl alcohol, and 91.37 wt % propane, (2) 1.73 wt % tetraethyloxysilane, 7.69 wt % isopropyl alcohol, and 90.58 wt % propane, and (3) 2.57 wt % tetraethyloxysilane, 7.63 wt % isopropyl alcohol, and 89.8 wt % propane. Thin films were deposited as substrate moved across the flame of the combusted precursor solutions. Under scanning electron microscope, surface roughness increased with increasing concentration of tetraethyloxysilane.

EXAMPLE 8

Silica solution for CCVD was consisted of 0.87 wt % tetraethyloxysilane, 7.76 wt % isopropyl alcohol, and 91.37 wt % propane. Thin films were deposited as substrate moved across the flame of the combusted precursor solutions. The capacitance increased from 16.0 nF in a capacitor with a slower feed rate (3 ml/min) to 39.6 nF in a capacitor with a higher feed rate (5 ml/min) due to surface roughening.

EXAMPLE 9

Silica ($SiO_2$) was deposited via CCVD processing (from TEOS, tetraethoxysilane, in ISP, isopropanol) as a base layer onto the superalloy MAR-M247 prior to the deposition of alumina ($Al_2O_3$) (from aluminum acetylacetonate). The silica was deposited initially at a temperature 200 to 300° C. less than that of the alumina. After the alumina deposition, no substrate oxides were visible via SEM on the surface of the specimen. Specimens that only received an alumina coating showed, through SEM observation, the presence of substrate oxides grown on the surface.

EXAMPLE 10

Silica was deposited via CCVD processing onto an iron/cobalt alloy, which was easily subject to oxidation, as a base layer for further silica deposition at a higher temperature. The initial silica coating was deposited at a temperature 100° C. lower than the subsequent silica deposition. The base layer was deposited along the perimeter of the substrate, which was the most susceptible area to oxidation. The base layer protected the substrate from oxidation during the deposition at the higher temperature. Specimens without the base layer tended to oxidize during deposition due to the higher, but desired, deposition temperature.

EXAMPLE 11

A silicon/lead oxide base layer was applied to copper foil before a lead/aluminum/boron/silicon oxide coating to protect the substrate from higher temperatures it would experience in the subsequent deposition. This higher temperature resulted from either using a higher flame temperature at the surface or from using less auxiliary back cooling than was used for the base layer deposition.

EXAMPLE 12

Platinum and Gold layers were deposited as follows:

| Component | wt % Optimum Variation | Toluene wt % Optimum Variation | Methanol wt % Optimum Variation | Propane wt % Optimum Variation | Isopropyl alcohol wt % Optimum Variation |
|---|---|---|---|---|---|
| *platinum (II) acetylacetonate | 0.33 best +/−0.14 good 0.05 | 19.3 best +/− 1.5 good 2–100 | 80.4 best +/−2 good 0–98 | | |
| Diphenyl Pt | 0.76 best 0.38–1.52 | 60.99 50–100 | | 38.3 0–49.6 | |
| chlorotriethylphosphine gold (I) | 0.3 best +[|]m− 0.14 good | 59 +/−1 | | 40.7 +/−1 | |
| Chlorotriethylphosphine gold | 0.15 +/−15 | 22.7 +/−8 | | | 77.2 +/−7 |

*Note:
Pt precursor solution was prepared as follows: platinum (II) acetylacetonate mixed with toluene, sonicated for several minutes before adding methanol. Two different kinds of Pt solutions were also used prior to Pt/toluene/methanol solution. There were 0.3 wt % platinum (II) acetylacetonate mixed with 99.7 wt % toluene and 0.3 wt % platinum (II) acetylacetonate mixed with 92.6 wt % toluene and 7.1 wt % propane. Among these three solutions, Pt/toluene/methanol solution gave more stable flame, better atomization, and higher quality thin film.

also used prior to Pt/toluene/methanol solution. There were 0.3 wt % platinum (II) acetylacetonate mixed with 99.7 wt % toluene and 0.3 wt % platinum (II) acetylacetonate mixed with 92.6 wt % toluene and 7.1 wt % propane. Among these three solutions, Pt/toluene/methanol solution gave more stable flame, better atomization, and higher quality thin film.

Among three chromium precursor solutions, chromium (III) acetylacetonate solution gave best results in terms of thin film microstructure, atomization and solution stability.

EXAMPLE 13

Chromia Adhesion Improvement layers between dielectrics and electrodes are deposited as follows:
Chromia precursor solution

| Component | wt % Optimum Variation | Toluene wt % Optimum Variation | 1-butanol wt % Optimum Variation | Propane wt % Optimum Variation | reagent alcohol 90% ethanol 10% MeOH + isopropyl alcohol |
|---|---|---|---|---|---|
| chromium (III) 2-ethylhexanoate | 0.15–1.2 | 98.8–99.85 | | | |
| chromium carbonyl | 0.15 | | | | |
| chromium (III) acetylacetonate | 0.12 0.12–0.3 | 14.6 12–22 | 5.7 2.8–5.7 | 79.4 74–84 | |
| Cr | 0.91 w/o 0.3–1.82 | 14.2 10–50 | | | 8.5 50–89.7 |

EXAMPLE 14

SiO₂ - Pt solution

| Component | wt % Optimum Variation | | Toulene wt % Optimum Variation | | Methanol wt % Optimum Variation | | isopropyl alcohol wt % Optimum Variation | |
|---|---|---|---|---|---|---|---|---|
| tetraethyloxysilane | 0.84 | +/−0.5 | 16.6 | +/−1.3 | 77.6 | +/−1.76 | 7.62 | +/−2.6 |
| COD platinum(II) acetylacetonate | 0.34 | +/−0.01 | | | | | | |

SiO₂—Pt solution was prepared by ultrasonically mixing platinum (II) acetylacetonate, and toluene for several minutes before addition of methonal and the tetraethyloxysilane.

EXAMPLE 15

SiCrO$_x$ and CrO$_x$Pt precursor solutions

| component | wt % | isopropyl alcohol wt % | Toluene wt % | 1-butanol wt % | Propane wt % |
|---|---|---|---|---|---|
| SiCrO$_x$ | | | | | |
| tetraethyloxysilane | 0.95 | 7.87 | 21.3 | 4.3 | 65.2 |
| chromium (III) acetylacetonate, | 0.35 | | | | |
| CrO$_x$Pt | | | | | |
| chromium (III) acetylacetonate | 0.17 | | 21.5 | 8.31 | 70 |
| platinum (II) acetylacetonate | 0.023 | | | | |

The usable range of each component is 20 percent of variation from suggested formula.

EXAMPLE 16

Dielectric materials layers were deposited according to the following conditions:

| Component | wt % Optimum Variation | | isopropyl alcohol wt % Optimum Variation | | Toluene wt % Optimum Variation | | Propane wt % Optimum Variation | |
|---|---|---|---|---|---|---|---|---|
| Silica | | | | | | | | |
| tetraethyloxysilane | 0.873 | 0.873–1.7 | 7.76 | 7.76–12 | | | 91.4 | 88.9–9.2 |
| Lead silicate | | | | | | | | |
| tetraethyloxysilane | 0.496 | 0.16–0.72 | 17.8 | 7–29.1 | 17.3 | 0.94–29.8 | 64.4 | 40–92.1 |
| lead naphthenate | 0.013 | 0.01–0.08 | | | | | | |
| Electric glass | | | | | | | | |
| lead naphthenate | 0.36 | +/−0.04 | 19 | +/−6 | 23 | +/−9 | 57 | +/−14 |
| tetraethyloxysilane | 0.14 | +/−0.13 | | | | | | |
| aluminum acetylacetonate | 0.06 | +/−0.06 | | | | | | |
| trimethylborate | 0.03 | +/−0.03 | | | | | | |
| potassium ethoxide | 0.013 | +/−0.013 | | | | | | |
| sodium 2,2,6,6-teramethylheptane-3,5 -dionate | 0.05 | +/−0.05 | | | | | | |
| lithium t-butoxide | $4.5 \times 10^{-3}$ | +/− $4.5 \times 10^{-3}$ | | | | | | |

EXAMPLE 17

BST, LSC, and PLZT precursor solutions

| Component | wt % Optimum | Variation | Toluene wt % Optimum | Variation | 1-butanol wt % Optimum | Variation | Isopropyl alcohol wt % | Propane wt % Optimum | Variation |
|---|---|---|---|---|---|---|---|---|---|
| BST | | | | | | | | | |
| barium 2-ethylhexanoate | 0.79 | 0.11–0.83 | 17.4 | 8–18 | | | | 81.5 | 80–91.5 |
| strontium 2-ethylhexanoate | 0.14 | 0.08–0.20 | | | | | | | |
| titanium-(di-i-propoxide)bis(acetylacetonate) | 0.23 | 0.14–0.30 | | | | | | | |
| LSC | | | | | | | | | |
| lanthanum-2-ethylhexanoate | 0.21 | 0.09–0.38 | 2.35 | 2–14.2 | 6 | 0–7.5 | | 91.1 | 85–94 |
| strontium-2-ethylhexanoate | 0.15 | 0.04–0.3 | | | | | | | |
| cobalt-naphthenate | 0.1 | 0.04–0.18 | | | | | | | |
| PLZT | | | | | | | | | |
| lead (III) 2-ethylhexanoate | 0.05 | 0.03–0.18 | 0.96 | 0.9–12.8 | 8.6 | 0–10 | | 90.3 | 86.6–92 |
| lanthanum-2-ethylhexanoate | 0.01 | 0–0.15 | | | | | | | |
| zirconium n-butoxide | 0.04 | 0.035–0.05 | | | | | | | |
| titanium-(di-i-propoxide)bis(acetylacetonate) | 0.035 | 0.035–0.12 | | | | | | | |

EXAMPLE 18

PMN, PMY, PbTi O₃, PNZT precursor solutions:

| Component | wt % | Toluene wt % | 1-Butanol wt % | Isopropyl alcohol wt % | Propane wt % |
|---|---|---|---|---|---|
| PMN | | | | | |
| lead naphthenate | 0.14 | 15.9 | | | 83.8 |
| magnesium naphthenate | 0.04 | | | | |
| tetrakis(2,2,6,6-tetramethyl-3,5-heptanedionato) niobium | 0.12 | | | | |
| PMT | | | | | |
| lead naphthenate | 0.12 | 18.7 | | | 81.1 |
| magnesium naphthenate | 0.02 | | | | |
| tantalum (V) tetraethoxyacetyl acetonate | 0.06 | | | | |
| PbTiO₃ | | | | | |
| lead (III) 2-ethylhexanoate | 0.076 | 7.55 | 8.58 | | 83.7 |
| titanium-(di-i-propoxide)bis(acetylacetonate) | | | | | |
| PNZT | | | | | |
| lead (III) 2-ethylhexanoate | 0.03 | 1.1 | 8.3 | 0.12 | 90.4 |
| niobium ethoxide | 0.007 | | | | |
| zirconium 2-ethylhexanoate | 0.01 | | | | |
| titanium-(di-i-propoxide)bis(acetylacetonate) | 0.03 | | | | |

The usable range of each component is 20 percent of variation from suggested formula for optimization.

EXAMPLE 19 for strontium oxide barrier layer deposition.

Strontium oxide coatings were deposited onto Cu foil using the CCVD process. During the deposition the solution flow rate, oxygen flow rate and cooling air flow rate were kept constant. The solution of the strontium oxide precursor contained 0.71 wt % strontium 2-ethylhexanoate, 12.75 wt % toluene, and 86.54 wt % propane. The flow rate for the solution was 3.0 m/min and for the oxygen 3500 ml/min at 65 psi. The cooling air was at ambient temperature and the flow rate was 25 l/min at 80 psi. The cooling air was directed at the back of the substrate with a copper tube whose end was positioned 2 inches from the back of the substrate. The deposition was performed at 700° C. flame temperature which was measured at the substrate surface with a Type-K thermocouple. The cooling air flow rate can be in a range of 15 to 44 l/min. The deposition temperature can varies from 500 to 800° C.

EXAMPLE 20 for zinc oxide barrier layer deposition.

Zinc oxide coatings were deposited onto Cu foil using the CCVD process. During the deposition the solution flow rate, oxygen flow rate and cooling air flow rate were kept constant. The solution of the zinc oxide precursor contained 2.35 wt % zinc 2-ethylhexanoate, 7.79 wt % toluene, and 89.86 wt % propane. The flow rate for the solution was 3.0 ml/min and for the oxygen 4000 ml/min at 65 psi. The cooling air was at ambient temperature and the flow rate was 25 1/min at 80 psi. The cooling air was directed at the back of the substrate with a copper tube whose end was positioned 2 inches from the back of the substrate. The deposition was performed at 700° C. flame temperature which was measured at the substrate surface with a Type-K thermocouple. The cooling air flow rate can be in a range of 9 to 25 1/min. The deposition temperature can varies from 625 to 800° C.

EXAMPLE 21 for tungsten oxide barrier layer deposition.

Tungsten oxide coatings were deposited onto Cu foil using the CCVD process. During the deposition the solution flow rate, oxygen flow rate and cooling air flow rate were kept constant. The solution of the tungsten oxide precursor contained 2.06 wt % tungsten hexacarbonyl, 26.52 wt % toluene, and 73.28 wt % propane. The flow rate for the solution was 3.0 ml/min and for the oxygen 3500 ml/min at 65 psi. No cooling air was used at 350° C. deposition temperature. The temperature was measured at the substrate surface with a Type-K thermocouple. The cooling air flow rate can be introduced in the deposition and directed at the back of the substrate in a range of 7 to 10 1/min. The deposition temperature can varies from 350 to 800° C.

What is claimed is:

1. A method of forming at least one capacitor comprising
providing a first metal foil layer,
depositing on said metal foil layer a dielectric material layer between about 0.03 and about 2 microns thick, and
depositing on said dielectric material a second metal layer.

2. The method according to claim 1 wherein said dielectric material layer is deposited by combustion chemical vapor deposition.

3. The method according to claim 1 wherein said second metal layer is deposited by combustion chemical vapor deposition or controlled atmosphere combustion chemical vapor deposition.

4. The method according to claim 1 wherein said second metal layer is formed by depositing an electrically conductive seed layer by combustion chemical vapor deposition or controlled atmosphere combustion chemical vapor deposition and additional metal for said second metal layer is deposited by electroplating.

5. The method according to claim 1 wherein prior to depositing said dielectric layer on said metal foil layer, a barrier layer between about 0.01 and about 0.08 microns thick is deposited on said foil to protect said metal foil layer from excessive temperature during deposition of said dielectric material layer and/or to prevent oxidation of said metal foil layer and/or to prevent chemical interaction between said metal foil layer and said dielectric material layer.

6. The method according to claim 26 wherein prior to depositing said second metal layer, a layer of material is deposited between about 0.001 and about 0.05 microns thick, which layer of material promotes adhesion between said dielectric material layer and said second metal layer.

7. The method according to claim 1 wherein second metal layer is patterned so as to provide a plurality of discrete capacitor plates.

8. The method according to claim 7 wherein said patterned second material layer is laminated to dielectric material and said metal foil layer is patterned to form a plurality of discrete capacitor plates.

9. The method according to claim 8 wherein patterned metal foil layer is laminated to dielectric material.

10. A method of providing at least one thin layer capacitor comprising
providing a polymeric support sheet,
depositing on said support sheet a first metal layer between about 0.05 and about 3 microns thick,
depositing on said first metal layer a dielectric material layer between about 0.03 and about 2 microns thick, and
deposition on said dielectric material layer a second metal layer between about 0.05 and about 3 microns thick.

11. The method according to claim 10 wherein said second metal layer is subsequently patterned so as to form discrete capacitor plates.

* * * * *

UNITED STATES PATENT AND TRADEMARK OFFICE
CERTIFICATE OF CORRECTION

PATENT NO. : 6,207,522 B1
DATED : March 27, 2001
INVENTOR(S) : Hunt et al.

It is certified that error appears in the above-identified patent and that said Letters Patent is hereby corrected as shown below:

Column 1,
Line 32, after "FORMATION OF THIN FILM CAPACITORS" the following paragraph should be inserted:

-- This invention was made with Government support under contract N00014-99-C-0199 awarded by Office of the Naval Research. The Government has certain rights in the invention. --

Signed and Sealed this

Fifteenth Day of March, 2005

JON W. DUDAS
*Director of the United States Patent and Trademark Office*